United States Patent
Matsui et al.

(10) Patent No.: US 7,340,692 B2
(45) Date of Patent: Mar. 4, 2008

(54) SYSTEM LSI DEVELOPMENT APPARATUS AND THE METHOD THEREOF FOR DEVELOPING A SYSTEM OPTIMAL TO AN APPLICATION

(75) Inventors: Nobuo Matsui, Kanagawa-ken (JP); Atsushi Mizuno, Kanagawa-ken (JP); Ryuichiro Ohyama, Tokyo (JP); Megumi Tangoda, Tokyo (JP); Katsuya Uchida, Tokyo (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 0 days.

(21) Appl. No.: 10/621,449

(22) Filed: Jul. 18, 2003

(65) Prior Publication Data

US 2005/0076314 A1    Apr. 7, 2005

Related U.S. Application Data

(62) Division of application No. 09/865,289, filed on May 29, 2001, now Pat. No. 6,634,017.

(30) Foreign Application Priority Data

Feb. 2, 2001    (JP)    ............ 2001-027432

(51) Int. Cl.
  *G06F 17/50*    (2006.01)
  *G06F 13/10*    (2006.01)
(52) U.S. Cl. .............. 716/1; 716/2; 716/4; 716/5; 716/18; 703/14; 703/20; 703/21
(58) Field of Classification Search .............. 716/1, 716/2, 4, 5, 11; 703/21, 23, 27, 28; 712/23, 712/35, 45; 707/118; 257/723
See application file for complete search history.

(56) References Cited

U.S. PATENT DOCUMENTS 5,423,023 A    6/1995    Batch et al.
5,493,508 A    2/1996    Dangelo et al.

(Continued)

FOREIGN PATENT DOCUMENTS

WO    WO 00/22553    4/2000

(Continued)

OTHER PUBLICATIONS

Berekovic et al., "A core generator for fully synthesizable and highly parameterizable RISC-cores for system-on-chip designs", Oct. 8-10, 1998, Signal Processing Systems, 1998. SIPS 98. 1998 IEEE Workshop on, pp. 561-568.*

(Continued)

*Primary Examiner*—Stacy A Whitmore
*Assistant Examiner*—Helen Rossoshek
(74) *Attorney, Agent, or Firm*—Oblon, Spivak, McClelland, Maier & Neustadt, P.C.

(57) ABSTRACT

In this disclosure, based on change item definition information concerning system LSI development and design, software used for development and design of a system LSI that contains a processor having optional instructions defined therein is operated, and system LSI hardware description, verification environment and a development and design tools are generated, thus making it possible to develop a system LSI optimal to an application within a short period.

13 Claims, 19 Drawing Sheets

U.S. PATENT DOCUMENTS

| | | | | |
|---|---|---|---|---|
| 5,565,706 | A * | 10/1996 | Miura et al. | 257/723 |
| 5,592,679 | A * | 1/1997 | Yung | 712/23 |
| 5,896,521 | A * | 4/1999 | Shackleford et al. | 703/21 |
| 6,006,022 | A | 12/1999 | Rhim et al. | |
| 6,134,710 | A * | 10/2000 | Levine et al. | 717/158 |
| 6,135,647 | A * | 10/2000 | Balakrishnan et al. | 716/18 |
| 6,175,946 | B1 * | 1/2001 | Ly et al. | 716/4 |
| 6,247,084 | B1 * | 6/2001 | Apostol et al. | 710/108 |
| 6,574,590 | B1 * | 6/2003 | Kershaw et al. | 703/28 |
| 6,634,017 | B2 * | 10/2003 | Matsui et al. | 716/11 |
| 6,862,563 | B1 * | 3/2005 | Hakewill et al. | 703/14 |
| 6,864,710 | B1 * | 3/2005 | Lacey et al. | 326/39 |
| 7,020,854 | B2 * | 3/2006 | Killian et al. | 716/1 |
| 2001/0020224 | A1 * | 9/2001 | Tomit | 703/23 |
| 2001/0049769 | A1 * | 12/2001 | Ono | 711/118 |
| 2002/0046391 | A1 | 4/2002 | Ito et al. | |
| 2004/0250231 | A1 * | 12/2004 | Killian et al. | 716/18 |
| 2005/0166027 | A1 * | 7/2005 | Uchiyama | 711/169 |

FOREIGN PATENT DOCUMENTS

| | | |
|---|---|---|
| WO | WO 00/46704 | 8/2000 |

OTHER PUBLICATIONS

Ghosh et al., "Hierarchical test generation and design for testability methods for ASPPs and ASIPs", 3, Mar. 1999, Computer-Aided Design of Integrated Circuits and Systems, IEEE Transactions on, vol. 18, pp. 357-370.*

Gottlieb et al., "Clustered programmable-reconfigurable processors", Dec. 16-18, 2002, ☐☐Field-Programmable Technology, 2002. (FPT). Proceedings. 2002 IEEE International Conference on, pp. 134-141.*

Cook et al., "Mapping computation kernels to clustered programmable-reconfigurable processors", Dec. 15-17, 2003, Field-Programmable Technology (FPT), 2003. Proceedings. 2003 IEEE International Conference on, pp. 435-438.*

Morris et al., "A re-confiigurable processor for Petry net simulation", Jan. 4-7, 2000, System Sciences, Proceedings of the 33rd Annual Hawaii International Conference on, pp. 9 pp., vol. 1.*

Sanchez et al., "Static and dynamic confiigurable systems", Jun. 1999, Compurters, IEEE Transactions on, vol. 48, Issue 6, pp. 556-564.*

Morris et al., "A scalable re-configurable processor", Jan.-Feb. 3, 2000, Computer Architecture Conferemce, 5th Australasian, pp. 64-73.*

Petit et al.,"A new processor architecture exploiting ILP with a reduced instruction word", Feb. 12, 1998, High Performance Architectures for Real-Time Image Processing (Ref.No. 1998/197), IEEE Colloquium on, pp. 2/1-2/5.*

Borgatti et al., "A reconfigurable system featuring dynamically extensible embedded microprocessor, FPGA and cestomizable I/O", 2002, IEEE Custom integrated circuits Conference, pp. 2-3-1-2-3-4.*

Milligan et al., "Processor implementations using queues", Aug. 1995, Micro, IEEE, vol. 15, Issue 4, pp. 58-66.*

Benoit et al., "Metrics for reconfigurable architectures characterization: remanence and scalability", Apr. 22-26, 2003, Parallel anddistributed processing symposium, Proceedings, International, pp. 8 pp.*

Memik et al., "An integrated approach for improving cache behavior", 2003, Design, Automation and test in Europe Conference and Exhibition, pp. 796-801.*

Kastrup et al., "A novel approach to minimising the logic of combinatorial multiplexing circuits in product-term-based hardware", 2000, IEEE, Averito University, Portugal, pp. 164-171.*

Sasaki et al., "Reconfigurable synchronized dataflow processor", 2000, IEEE, pp. 27-28.*

Barat et al., "Software pipelining for coarse-grained reconfigurable instruction set processors", 2002, Peoceedings of the 15-th International Conference on VLSI design, IEEE, Pages.*

Power efficient mediaprocessors: design space exploration☐☐Kin et al., Power efficient mediaprocessors: design space exploration, Jun. 21-25, 1999, Design Automation Conference, 1999. Proceedings. 36th, pp. 321-326 ☐☐.*

Tabbara et al.; "Fast hardware-software co-simulation using VHDL models"; Mar. 9-12, 1999; Design, Automation and Test in Europe Conference and Exhibition 1999. Proceedings; pp. 309-316.*

Bhattacharya et al.; "An RTL methodology to enable low overhead combinational testing"; Mar. 17-20, 1997; European Design and Test Conference, 1997. ED&TC 97. Proceedings; pp. 146-152.*

Ricardo E. Gonzalez, XTENSA: A Configurable and Extensible Processor, IEEE micro 2000 No. 2, pp. 60-70.

* cited by examiner

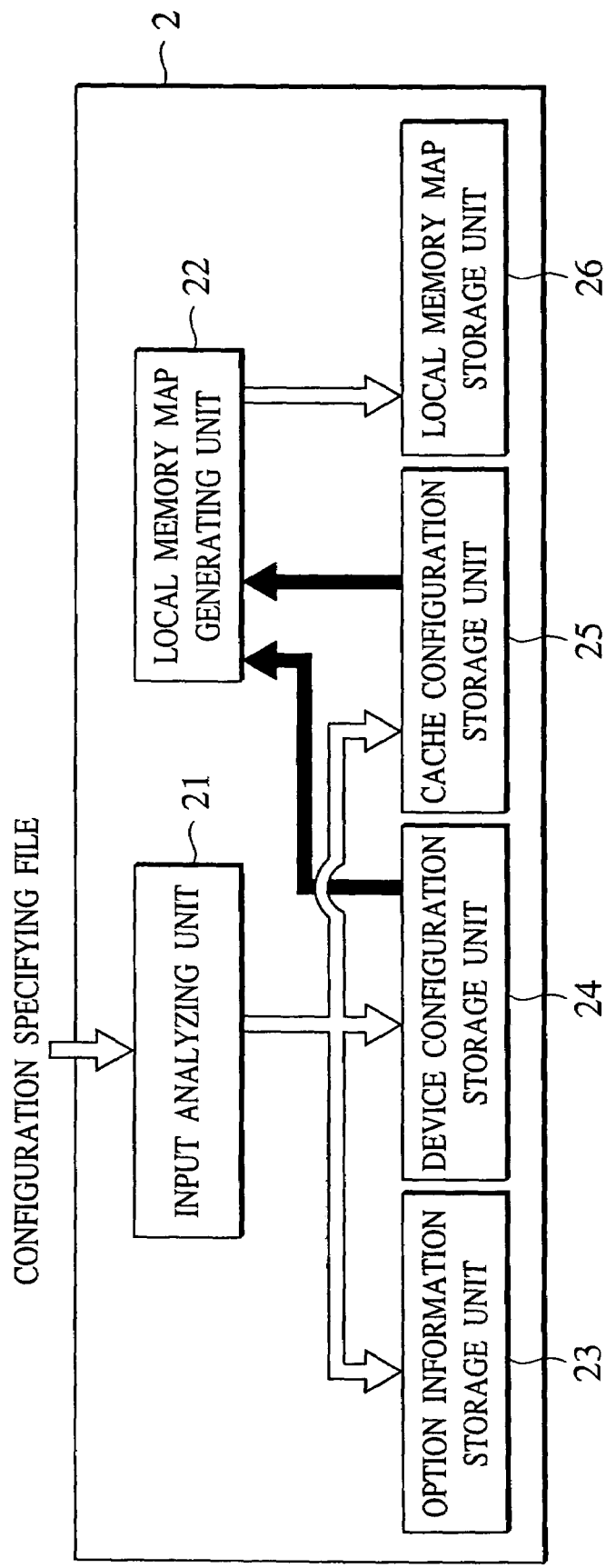

FIG.3

```
//configuration data
CHIP_NAME="SimpleChip1";//CHIP NAME
FREQUENCY=200;          //FREQUENCY UNIT.MHz,
//PROCESSOR1
P_MODULE[Processor1](
     P_ENGINE(
          //SPECIFICATION OF PROCESSOR CORE
          CORE{
               ID=0; //CORE ID
               //OPTION COMMAND
               DIV=ON; //DIVIDING COMMAND
               MINMAX=ON; //MAXIMUM / MINIMUM VALUE COMMAND
               BIT=ON; //BIT OPERATION COMMAND
          };
          IMEM{
               SIZE=4;     //KB
          };
          DMEM{
               SIZE=2;     //KB BIU{ //BUS INTERFACE COMMAND
               BUS_SIZE=64 ;
          };
          INTC{ //INTERRUPT CONTROLLER
               CHANNEL_BITW=16 ;//NOT DEFINED
               LEVEL=15 ;//NOT DEFINED
          };
          DSU{ //DEBUG UNIT
               INST_ADDR_BREAK_CHANNEL=1 ;
               DATA_ADDR_BREAK_CHANNEL=1;
          };
     );
);
//PROCESSOR2
P_MODULE[Processor2](
     P_ENGINE(
          CORE{
               ID=1; //CORE ID
               //OPTION COMMAND
               DIV=ON; //DIVIDING COMMAND
               MINMAX=OFF; //MAXIMUM / MINIMUM VALUE COMMAND
               BIT=OFF; //BIT OPERATION COMMAND
          };
          IMEM{ //COMMAND RAM
               SIZE=8 ;    //KB
          };
          DMEM{ //DATA RAM
               SIZE=20 ;   //KB
          };
          ICACHA{ //COMMAND CACHE
               SIZE=4 ;    //KB
          };
          DCACHE{ //DATA CACHE
               SIZE=8 ;    //KB
          };
     );
     //COPROCESSOR
     COPRO[Cop1]{
          IS_VLIW=YES ;//VLIW TYPE COPROCESSOR
          VLIW_BTW=32 ;//COMMAND LENGTH 32 BITS
          ISA_DEFINE="cop1.isa" ;//ISA DEFINITION, ANOTHER FILE
          RTL    ="cop1.v"      //RTL DESCRIPTION, ANOTHER FILE
     };
//USER DEFINITION
UCI{
     ISA_DEFINE="uxi1.uci" ;//ISA DEFINITION, ANOTHER FILE
     RTL="uci1.v" ;//RTL DESCRIPTION, ANOTHER FILE
     SIM="ucimodel.c" ;       //HARDWARE C MODEL,ANOTHER FILE
     };
);
//GLOBAL MAP
GLOBAL_MAP=:schip1.map ;//SPECIFY ANOTHER FILE
//end of file
```

FIG.4A

```
//start : size : name : cache(opt) : shadow_original_start(opt) : scope : type : read_write(opt)
0X0000_0000 : 0X0020_0000 : RAM1 :            : : global : memory : ro ;
0X0080_0000 : 0X0080_0000 : RAM2 : Cache : : global : memory : rw ;
0X8080_0000 : 0X0080_0000 : RAM3 :            : : global : memory : rw ;
```

FIG.4B

```
:RAM1       :0X00000000 : 0X00200000 :              :global : ro::   memory:
:Imem0      :0X00200000 : 0X00002000 :              : local : rw::   Imem:         in mm
:Imem1      :0X00202000 : 0X00002000 :              : local : rw::   Imem:         in mm
:dmem0      :0X00208000 : 0X00004000 :              : local : rw::   dmem:         in mm
:dmem1      :0X0020c000 : 0X00004000 :              : local : rw::   dmem:         in mm
:icahe_dat  :0X00300000 : 0X00004000 :              : local : rw:: icache_data:    in mm
:icache_tag :0X00310000 : 0X00004000 :              : local : rw:: Icache_tag:     in mm
:RAM2       :0X00800000 : 0X00800000 : cache        :global : rw::   memory:
:RAM3       :0X00808000 : 0X00800000 :              :global : rw::   memory:
```

FIG.4C

DECLARING COMMAND MNEMONIC, OPERATION CODE, AUGMENT

```
void xor(int_reg_modify,int_reg_arc) ;
{
        code16="0000_0010_0000" ;
}
short xori(int_reg_src,signed char_imm);
{
        code16="0000_0011_iiii_iiii";
}
```

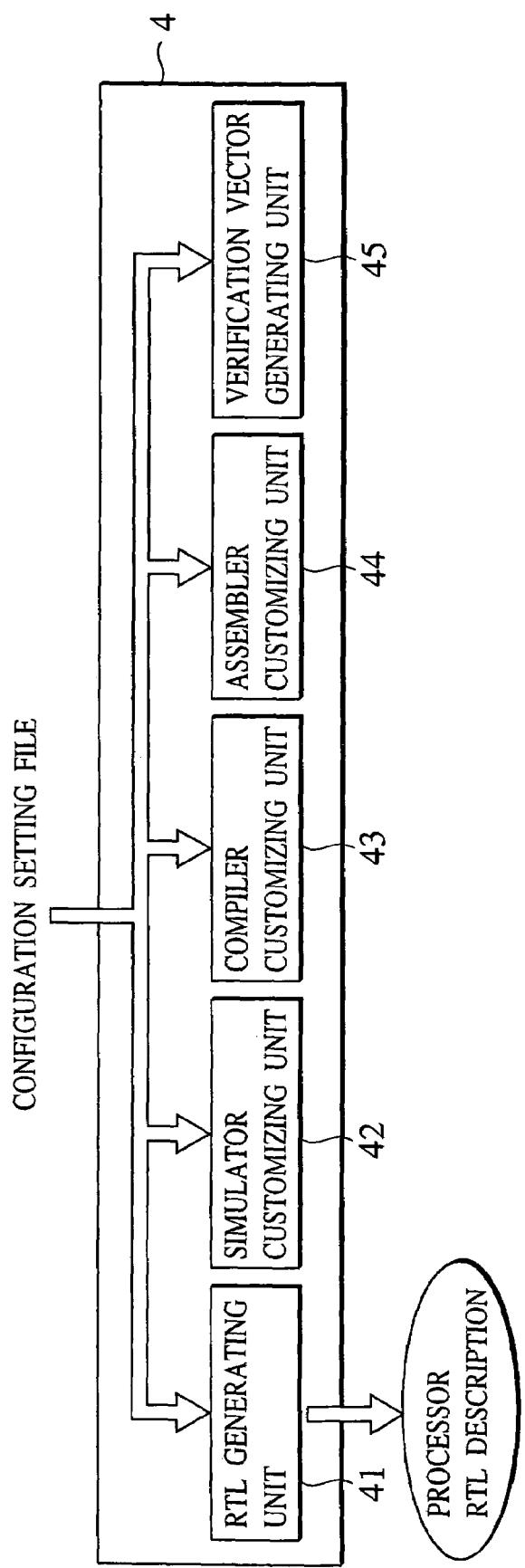

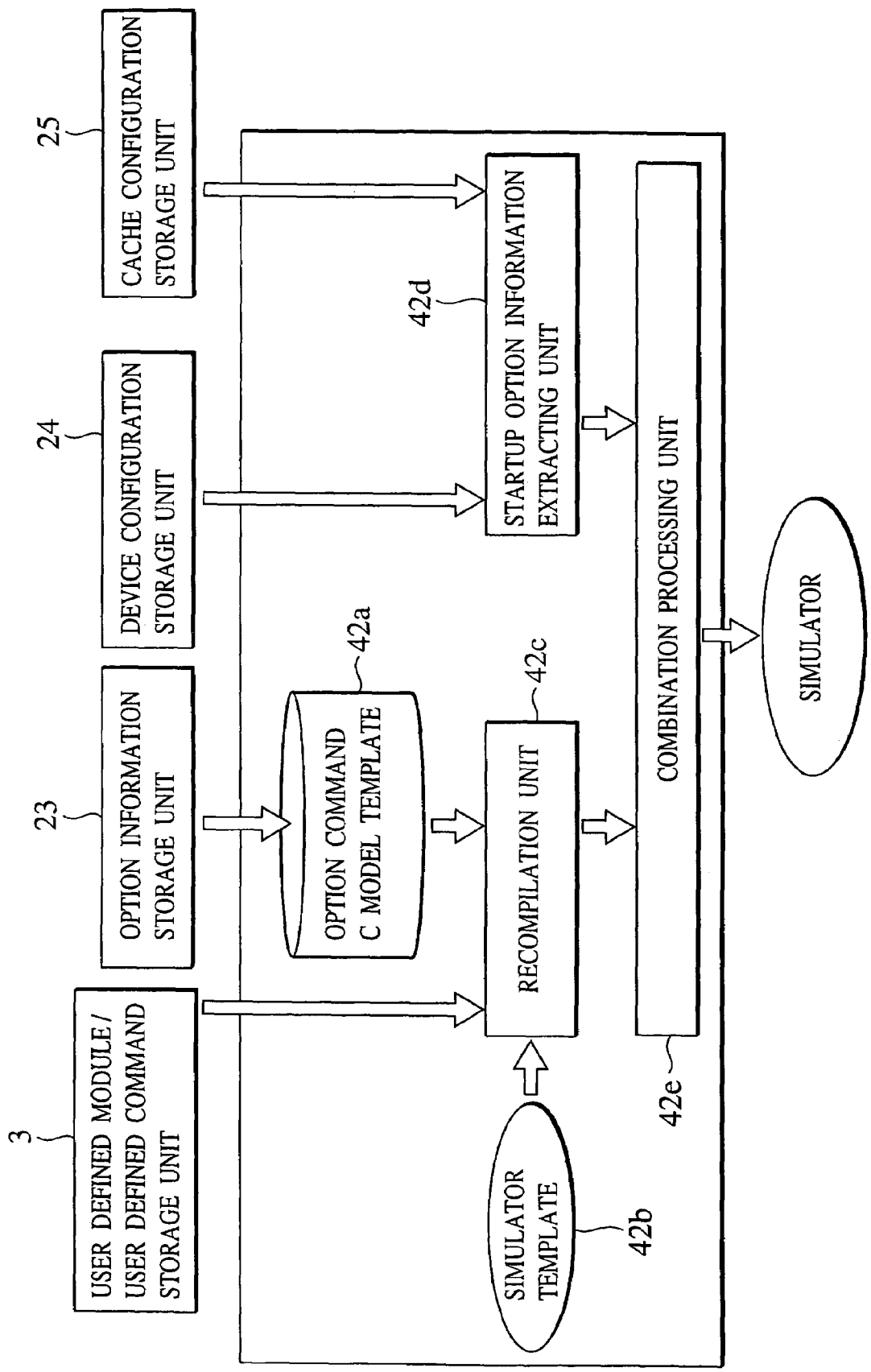

FIG.9A

```
-opt_minmax=ON
-opt_div=ON
-opt_bit=OFF
-rom=0x00000000,0x00200000
-imem=0x00200000,0x00300800
-dmem=0x00300000,0x00400000
-icache=0x00400000,0x007f0000
-dcache=0x007f0000,0x00800000
-ram=0x00800000,0x01000000
-ram-shadow=0x80800000,0x81000000
      ⋮
```

FIG.9B

```
-rom=0x00000000,0x00200000
-imem=0x00200000,0x00300800
-dmem=0x00300000,0x00400000
-icache=0x00400000,0x007f0000
-dcache=0x007f0000,0x00800000
-ram=0x00800000,0x01000000
-ram-shadow=0x80800000,0x81000000
      ⋮
```

FIG.9C

```
// OPTION COMMAND
void_asm min(int_reg_modify,int_reg_src);
void_asm max(int_reg_modify,int_reg_src);
// USER DEFINED COMMAND
void_asm xor(int_reg_modify,int_reg_src);
short_asm xori(int_reg_src,signed char_imm);
      ⋮
```

FIG.11A

```
-opt_minmax=ON

-opt_div=ON

-opt_bit=OFF
        :
```

FIG.11B

```
-------------------------------------------------------------------
XOR    Rn, Rm         {(Rn,32,U,1,1),(Rm,32,U,1,0)}
XOR1   Rn, Rm, Imm8   {(Rn,32,U,1,1),(Rm,32,U,1,0) , (Imm8,U,1,0)}
-------------------------------------------------------------------
#XOR FORMAT WHEN PORTIONS OF Rn and Rm ARE ASSEMBLERS
#FOLLOWING OPERAND DEFINITION
#Rn OPERAND DISP AT(Rn,32,U,1,1). 32 IS THE NUMBER OF BITS
#U SHOWS WHETHER A CODE IS PRESENT OR ABSENT (U IS UNSIGNED).
#THE NEXT 1 INDICATES THAT Rn IS A SOURCE OPERAND. THE LAST 1
#INDICATES THAT Rn IS A DESTINATION OPERAND
```

FIG.12A

```
int x=0 ;

main( ) { int i , j ;
    for(i=0 ; i<10 ; i++)
        for(j=0 ; j<5 ; j++)
            x+=i*j ;
    printf("result=%d¥n", x) ;
    }
```

FIG.12B

```
int x=0 ;

main( ) { int i , j ;
    for(i=0 ; i<10 ; i++){
_START(1)
        for(j=0 ; j<5 ; j++)
            x+=i*j ;
_END(1)
        }
    printf("result=%d¥n", x) ;
    }
```

FIG.13A

| NUMBER | START ADDRESS | END ADDRESS | NUMBER OF COMMANDS |
|---|---|---|---|
| 1 | 0x8001e | 0x80038 | 370 |

FIG.13B

| NUMBER | START ADDRESS | END ADDRESS | NUMBER OF CYCLES |
|---|---|---|---|
| 1 | 0x8001e | 0x80038 | 500 |

FIG.13C

| CACHE SIZE | CACHE ERROR RATE |
|---|---|
| 1Kbytes | 0.191 |
| 2Kbytes | 0.148 |
| 4Kbytes | 0.109 |
| 8Kbytes | 0.087 |
| 16Kbytes | 0.066 |

FIG.15A

```
        move R5, 0x00080000
        move R6, 0x00090000
        move R7, 0x00080100
loop :
        ld        R1,    (R5)
        ld        R2,    4(R5)
        call      _Culc           // TO SUBROUTINE
        st        R1,    (R6)
        add       R6,    4
        add       R5,    8
        not_equal R5,    R7, loop  //if R5 !=R7 then jump roop
```

FIG.15B

```
Move R1, 0x00080000        //SUBSTITUTE START ADDRESS INTO R1
Move R2, 0x00080100        //SUBSTITUTE START ADDRESS INTO R2
Move R3, 0x00090000        //SUBSTITUTE COMPUTATION RESULT STRAGE START LOCATION INTO R3
Move R4, 0x00000001        //SUBSTITUTE DSP START VALUE INTO R4
St_cntibus R1,(cntibus_addr1) //SPECIFY READ START LOCATION
St_cntibus R2,(cntibus_addr2) //SPECIFY READ END LOCATION
St_cntibus R3,(cntibus_addr3) //SPECIFY START LOCATION OF REWRITING COMPUTATION RESULT
St_cntibus R4,(cntibus_addr4) //START DSP PROCESSING
(COREPROCESSOR CONTINUES OTHER PROCESSING, WAIT FOR THE END OF DSP,AND CONTINUES PROCESSING)
```

FIG.15C

```
Tyedef unsigned long    address;
class DSP_HWEngine : public =HWEngine, public ControlBus
{
public :
    virtual bool read_cntibus(address adr, unsigned long* data) ;
    virtual bool write_cntibus(address adr, unsigned long data) ;
    virtual bool do_command(unsigned long s1,unsigned long s2,unsigned long operand,
                            unsined long* ret) ;
}
```

FIG.16

```
Bool DSP_HWEngine ::read_cntibus(address adr, unsigned loog* data)
{
    * date=contibus[adr];
    return true ;
}
bool DSP_HWEngine ::write_cntibus(address adr, unsigned loog data)
{
    if(adr==cntibus_addr4)//VALUE IS WRITTEN IN DSP CONTROL REGISTER
    {
        PROCESSING IS PERFORMED FOR WRITEN VALUE
        return true ;
    }
    contibus[adr]=data
    return true ;
} bool DSP_HWEngine :: do_command(unsigned long s1, unsigned long s2, unsigned long operand,
unsigned long* ret)
{
if(operand&0x0000ff00)==0x60)
{
   PROCESSING OF COMMAND CODE 0x60 IS WRITTEN, COMMAND SOURCE IS
   DO_COMMAND FUNCTION AUGMENT, A1 AND A2, DESTINATION IS "RET"
   THE COMPUTATION RESULT IS PLACED IN "RET", AND IS RETURNED
   *RET=RESULT
   return true ;
   }
WHEN A USER DEFINED COMMAND IS PRESENT,"IF" ARE ARRANGED IN PLURALITY
Else if( )
{

```
Class CORE
{
public :
        void one_step_execute() ;
};
```

FIG.17B

```
Core1_config_set()
{
        //CORE1 OBJECT GENERATION
        //CORE1 OPTION COMMAND SETTING
        //SETTING OF HARDWARE ENGINE AND THE LIKE
        //OTHER SETTINGS(CACHE OR COPROCESSOR)
}
Core2_config_set()
{
        //CORE2 OBJECT GENERATION
        //CORE2 OPTION COMMAND SETTING
        //SETTING OF HARDWARE ENGINE AND THE LIKE
        //OTHER SETTINGS(CACHE OR COPROCESSOR)
}
Core3_config_set()
{
        //CORE3 OBJECT GENERATION
        //CORE3 OPTION COMMAND SETTING
        //SETTING OF HARDWARE ENGINE AND THE LIKE
        //OTHER SETTINGS(CACHE OR COPROCESSOR)
}
```

FIG.18A

```
Module_set()
{
    //CALL SET FUNCTION OF EACH CORE AND GENERATE AND SET OBJECT
    Core1_config_set();
    Core2_config_set();
    Core3_config_set();
}
```

FIG.18B

```
One_set()
{
    Core1>one_step_execute();
    Core2>one_step_execute();
    Core3>one_step_execute();
}
```

SYSTEM LSI DEVELOPMENT APPARATUS AND THE METHOD THEREOF FOR DEVELOPING A SYSTEM OPTIMAL TO AN APPLICATION

CROSS REFERENCE TO RELATED APPLICATIONS

The subject application is a divisional of U.S. application Ser. No. 09/865,289 filed on May 29, 2001, now U.S. Pat. No. 6,634,017, the entire contents of which are hereby incorporated herein by reference, and is further related to subject matter disclosed in the Japanese Patent Applications No. Tokugan2001-027432 filed in Feb. 2, 2001, to which the subject application claims priority under the Paris Convention and which is incorporated by reference herein.

BACKGROUND OF THE INVENTION

1. Field of the Invention

The present invention relates to a system LSI development apparatus comprising a plurality of software components that operate on a computer system, used for developing and designing a system LSI that contains a configurable processor having at least an optional instruction defined therein; and the system LSI development method thereof.

2. Description of the Related Art

In recent years, an LSI design and development system for developing an LSI optimal to applications within a short period of time is expected because of diversified needs for an LSI oriented to an embedded device such as multimedia processing and its shorter market cycle.

In general, in the case where a general-purpose processor is incorporated in an LSI, the hardware design cost is almost equal to zero; however, the performance of applications cannot be fully achieved. Therefore, recently, there has been provided a configurable processor in which instructions or memory configuration and the like can be selected, and at the same time, a configurable processor provider provides a system of specifying a configuration, thereby outputting a synthesizable hardware description According to such processor and system, optional instructions or memory size are specified, thereby making it possible to obtain a processor having its configuration optimal to applications within a short period of time.

On the other hand, in general, if an instruction set or the like is changed, a software development tool suite including compiler, assembler or instruction set simulator including system LSI components ("simulator" hereafter) must be changed. Thus, by specifying a configuration, there is provided a system of generating a software development tool suite as well as hardware description. According to such system, a workload and time required for designing a software development tool suite can be significantly reduced.

As has been described above, by using a configurable processor, a processor configuration optimal to applications can be obtained within a short period of time, and at the same time, software development can be performed in accordance with a conventional flow of operation. However, in order to better achieve the performance of applications, some parts of the applications are implemented as hardware, and it is considered that a system LSI has its configuration that is composed of processor and these dedicated hardware, which often results in an optimal LSI configuration. However, in prior art, only processor configuration can be customized, and a configuration including user defined hardware modules to be added to the processor cannot be handled. Thus, currently, as for an LSI configuration including processor and dedicated hardware configuration (description), architecture consideration, performance evaluation, design verification and software development cannot be performed, thus making it difficult to develop an LSI with its more optimal performance.

SUMMARY OF THE INVENTION

The present invention has been made in order to solve the foregoing technical problem. It is an object of the present invention to provide a technique, which makes it possible to develop and design an LSI with its optimal performance.

According to the present invention, there is provided a system LSI development apparatus comprising a plurality of software components that operate on a computer system, used for developing and designing a system LSI that contains a processor having at least an optional instruction defined therein, the system LSI development apparatus comprising: a system LSI development environment generating unit causing software to operate based on change item definition information concerning system LSI development and design, thereby generating hardware description, verification environment, and development and design tools for the system LSI, wherein the change item definition information contains at least one item of information concerning an optional instruction information, a user defined module and a multiprocessor configuration. According to the thus configured system LSI development apparatus, with respect to all possible combinations of change item definition information containing at least one of the optional instruction, user defined module and multiprocessor configuration, system LSI hardware containing a processor having at least an optional instruction defined therein, a plurality of verification environment and a development tool suite are consistently created in an exhaustive or parallel manner, thus making it possible to develop a system LSI optimal to applications within a short period of time.

Meanwhile, the term "unit" is used in the description of the embodiments of the present invention to represent a program or a section of a program that performs a particular task. Also, the term "change item" is used in the description of the embodiments of the present invention to represent a value (which is used usually as a constant in many cases but sometimes as a variable in a few cases) to be initialized with an arbitrary number or the like by the user in advance of compilation.

Other and further objects and features of the present invention will become obvious upon understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 2 is a block diagram depicting a configuration of a setting file generating unit according to other embodiment of the present invention;

FIG. 3 is a view showing a configuration file according to other embodiment of the present invention;

FIG. 4 is a view showing a global memory map, a local memory map, and user defined instructions according other embodiment of the present invention;

FIG. 5 is a block diagram depicting a configuration of a system LSI development environment generating unit according to other embodiment of the present invention;

FIG. 8 is a schematic view illustrating an operation of a simulator customizing unit according to other embodiment of the present invention;

FIG. 9 is a view showing a simulator startup option file, debugger startup option file and a machine instruction function declaration header file according to other embodiment of the present invention;

FIG. 11 is a view showing a compiler startup option file and a user defined instruction definition file for a verification vector generating unit according to other embodiment of the present invention;

FIG. 12 is a view showing an application program according to other embodiment of the present invention;

FIG. 13 is a view showing the number of executed instructions, the number of cycles during the execution and cache miss rate;

FIG. 15 is a view showing an application program example and a behavior level description example;

FIG. 16 is a view showing a behavior level description example;

FIG. 17 is a view showing a program code example;

FIG. 18 is a view showing a program code example; and

DETAILED DESCRIPTION OF THE PREFERRED EMBODIMENTS

Figure 1:
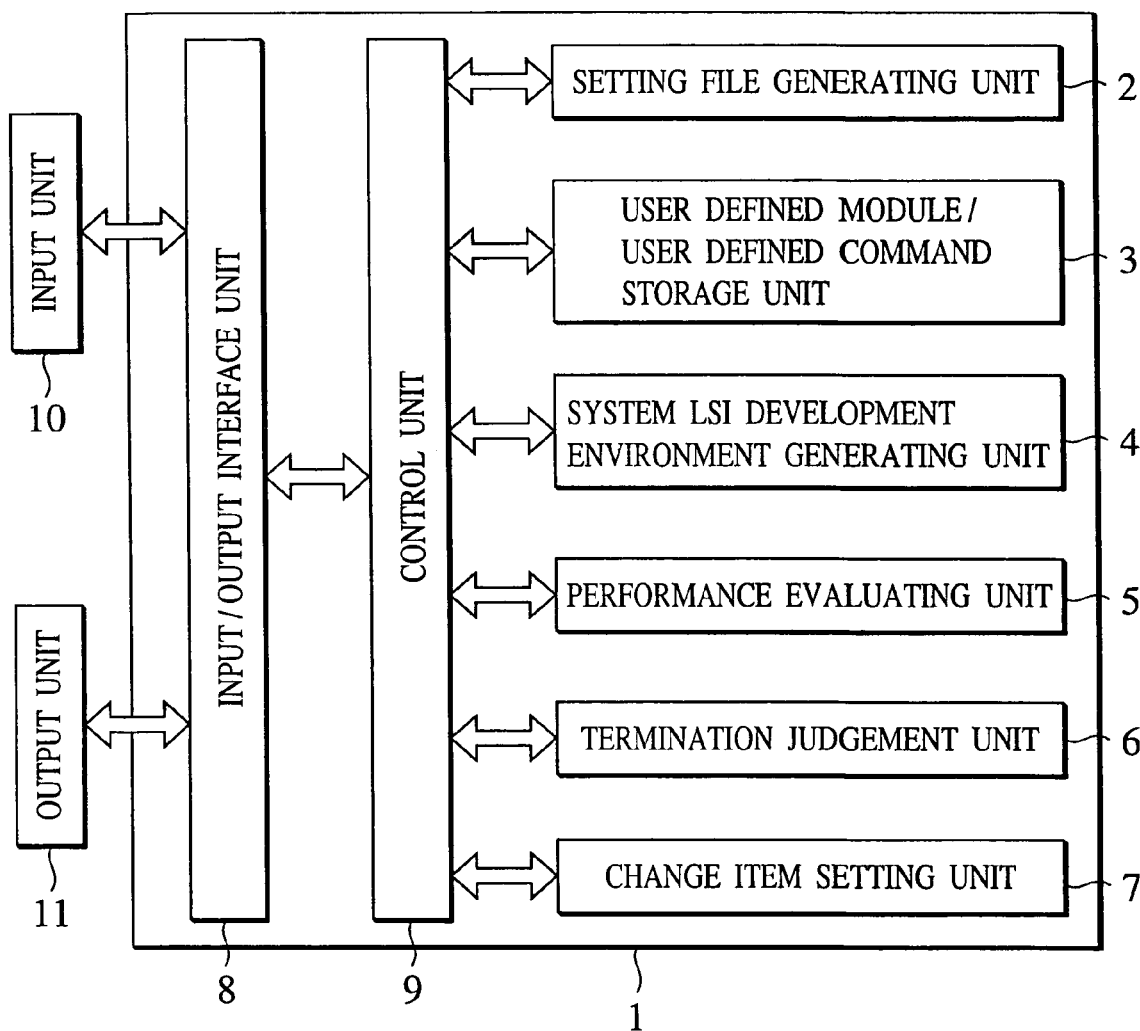
FIG. 1 is a block diagram depicting a configuration of a system LSI development apparatus according to one embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Hereinafter, a configuration of a system LSI development apparatus according to one embodiment of the present invention and an operation thereof will be described with reference to FIG. 1 to FIG. 19.

<<Configuration of System LSI Development Apparatus>>

First, a configuration of an LSI development apparatus according to one embodiment of the present invention will be briefly described with reference to FIG. 1.

A system LSI development apparatus 1 according to one embodiment of the present invention comprises: a setting file generating unit 2; a user defined module/user defined command storage unit 3; a system LSI development environment generating unit 4; a performance evaluating unit 5; a termination judgment unit 6; a change item setting unit 7; an input/output interface unit 8; and a control unit 9, as shown in FIG. 1.

In addition, the system LSI development apparatus 1 according to one embodiment of the present invention is connected to: an input unit 10 for inputting various items of information in the apparatus 1; and an output unit 11 for outputting various items of information from the apparatus 1. The input unit 10 can include a keyboard, a mouse pointer, a numeric keypad, a touch panel or the like, for example. The output unit 11 can include a display device, a printer or the like, for example.

Next, a configuration of each unit in this system LSI development apparatus will be described in detail with reference to FIG. 2 to FIG. 13.

"Configuration of Setting File Generating Unit"

A setting file generating unit 2 comprises: an input analyzing unit 21; a local memory map generating unit 22; an option information storage unit 23; a device configuration storage unit 24; a cache configuration storage unit 25; and a local memory map storage unit 26, as shown in FIG. 2. A system LSI design configuration is generated and stored based on a configuration specifying file describing a system LSI design configuration; variable value setting information; highest priority item setting information, target performance specifying information (including either or both of the hardware performance and software performance, and including hardware performance indexes such as chip size, frequency, power consumption, and including software performance indexes such as code size, number of valid instructions and number of execution cycles); and change item list information from the change item setting unit 7.

Hereinafter, a respective one of the constituent elements contained in the setting file generating unit 2 will be described.

<Configuration of Input Analyzing Unit>

An input analyzing unit 21 analyzes the contents of a configuration specifying file, and divides the contents of a configuration described in the configuration specifying file into each of the sections, i.e., the option information storage unit 23, device configuration storage unit 24 and cache configuration storage unit 25.

In the present embodiment, in the configuration specifying file, information such as presence or absence of optional instructions; presence or absence of devices (such as an instruction memory, a data memory, and a coprocessor are contained, and change items of the instruction memory and the data memory containing size and address); the presence or absence of cache; cache size, user defined instructions, user defined hardware modules memory map (this memory map contains an external memory area; an internal memory area; and an input/output region, and the external memory area contains an item for specifying a cache region. In addition, each memory area contains latency information); multiprocessor configuration (such as number of multiprocessors) or the like can be described. To specify user defined instructions or user defined hardware modules, a user describes a location of a files in which the user defined instructions or user defined modules are defined. (In the present embodiment, these files are located in the user defined module/user defined instruction storage unit 3.) The location can be specified by describing an absolute path or relative path and the like.

In addition, when a user specifies a system LSI design configuration by using a configuration specifying file, the user selects one value from among variable values defined in each of the storage units 23 to 26 contained in the setting file generating unit 2, and describes the selected value in the configuration specifying file as shown in FIG. 3.

That is, for example, in SIZE description shown below, any one of 1, 2, 4, 8, 16 and 32 KB can be selected as the built-in data memory size. In the case where this SIZE description is defaulted, it denotes 8 KB.

DMEM:

SIZE Ptype={1, 2, 4, 8, 16, 32}, default=8, comment="built-in data memory size"

In addition, in ISA_DEFINE description shown below, it denotes that an arbitrary character string must be specified as an ISA (Instruction Set Architecture) definition file name defining user defined instructions.

UCI:

ISA_DEFINE Ptype=string, default=" ", comment="ISA definition file name of user defined instructions"

The user can perform the above configuration setting work interactively via the input/output interface unit 8. By setting a configuration interactively, the user can set a configuration easily without worrying about a configuration specifying file syntax or the like, and a time required for configuration setting can be reduced as compared with a case of directly describing the configuration in a file. Further, the user can set all of the items in a configuration interactively, thus making it possible to prevent a mistake such that one item in a configuration is left without setting.

In addition, the user can set a variable value in a configuration. In the case where the variable value is set to the configuration, the setting file generating unit 2 uses any one of a basic set, a template made for measuring the variable value and the user set value so as to automatically derive the configuration settings. By setting the variable value to the configuration, the user can obtain a plurality of development environments and verification environments at the same time according to the configuration among variable range, thus making it possible to reduce an LSI development cycle.

Further, the user can set the highest priority item in a configuration. In the case where the highest priority item is set in the configuration, the setting file generating unit 2 derives values in a way that the values related to items other than the highest priority item are derived based on the basic set and the values related to the highest priority item are derived by using the template or the user specified settings, and generates a configuration such that the highest priority item is optimal. By specifying the highest priority item in the configuration, the user can get development environment and verification environment for a configuration suitable to the highest priority item without considering a system LSI configuration, and then can start evaluation of the configuration.

<Configuration of Local Memory Map Generating Unit>

A local memory map generating unit 22 generates a local memory map for each processor in the system LSI as shown in FIG. 4B, and stores the generated local memory map in a local memory map storage unit 26. Such a local memory map is generated by merging a global map information (memory area common to all processors. Refer to FIG. 4A, for example) specified from a configuration specifying file and local memory information on individual processors in a system LSI such as instruction memory, data memory, instruction cache and data cache. Here, local memory area information for each processor can be derived from memory size information specified in the configuration specifying file, and the local memory map for each processor is generated by inserting the local memory area information into the reserved memory areas for each of the individual local memory regions in the global map. In addition, shadow memory information on each processor may be specified in advance in the global map, whereby each processor can access the local memory of another processor through a shadow memory area in the global map.

<Configuration of Option information Storage Unit>

An option information storage unit 23 stores information concerning ON/OFF value of the optional instructions in the instruction set of the processor in a system LSI based on the analysis result of the configuration specifying file caused by an input analysis unit 21.

<Configuration of Device Configuration Storage Unit>

A device configuration storage unit 24 holds information concerning ON/OFF of the devices in the system LSI and their size; their address information; information concerning instruction memory or data memory; and information concerning optional hardware such as coprocessor caused by an input analysis unit 21.

<Configuration of Cache Configuration Storage Unit>

A cache configuration storage unit 25 holds information concerning ON/OFF of the cache in the system LSI; cache type (direct, 2-way, 4-way, n-way); cache size; caused by an input analysis unit 21.

<Configuration of Local Memory Map Storage Unit>

A local memory map storage unit 26 holds a local memory map generated by the local memory map generating unit 22.

"Configuration of User Defined Module/User Defined Command Storage Unit"

A user defined module/user defined command storage unit 3 holds information concerning user defined hardware modules and user defined instructions in the instruction set of the processor in the system LSI. Here, it is desirable that information concerning the user defined hardware modules are described in RTL description 30 or behavior level description, and information concerning instructions' operation are described in C/C++ model ("C model" hereafter), and is stored in the storage unit 3. The behavior level description and C model description may be identical to each other. In addition, information 35 concerning the user defined instructions are specified in a configuration specifying file. It is desirable that the above information concerning user defined instructions is described and stored in an ISA definition file as shown in FIG. 4C.

"Configuration of System LSI Development Environment Generating Unit"

A system LSI development environment generating unit 4 comprises: an RTL generating unit 41; a simulator customizing unit 42; a compiler customizing unit 43; an assembler customizing unit 44; and a test vector generating unit 45, wherein the hardware description of the system LSI, verification environment and development and design tools are generated with respect to all possible combinations of the configurations stored in the setting file generating unit 2 as shown in FIG. 2.

Hereinafter, an internal configuration of this system LSI development environment generating unit will be described in detail.

<Configuration of RTL Generating Unit>

An RTL generating unit 41 generates RTL descriptions of the system LSI based on the configurations stored in the storage unit of the setting file generating unit 2.

Figure 6:
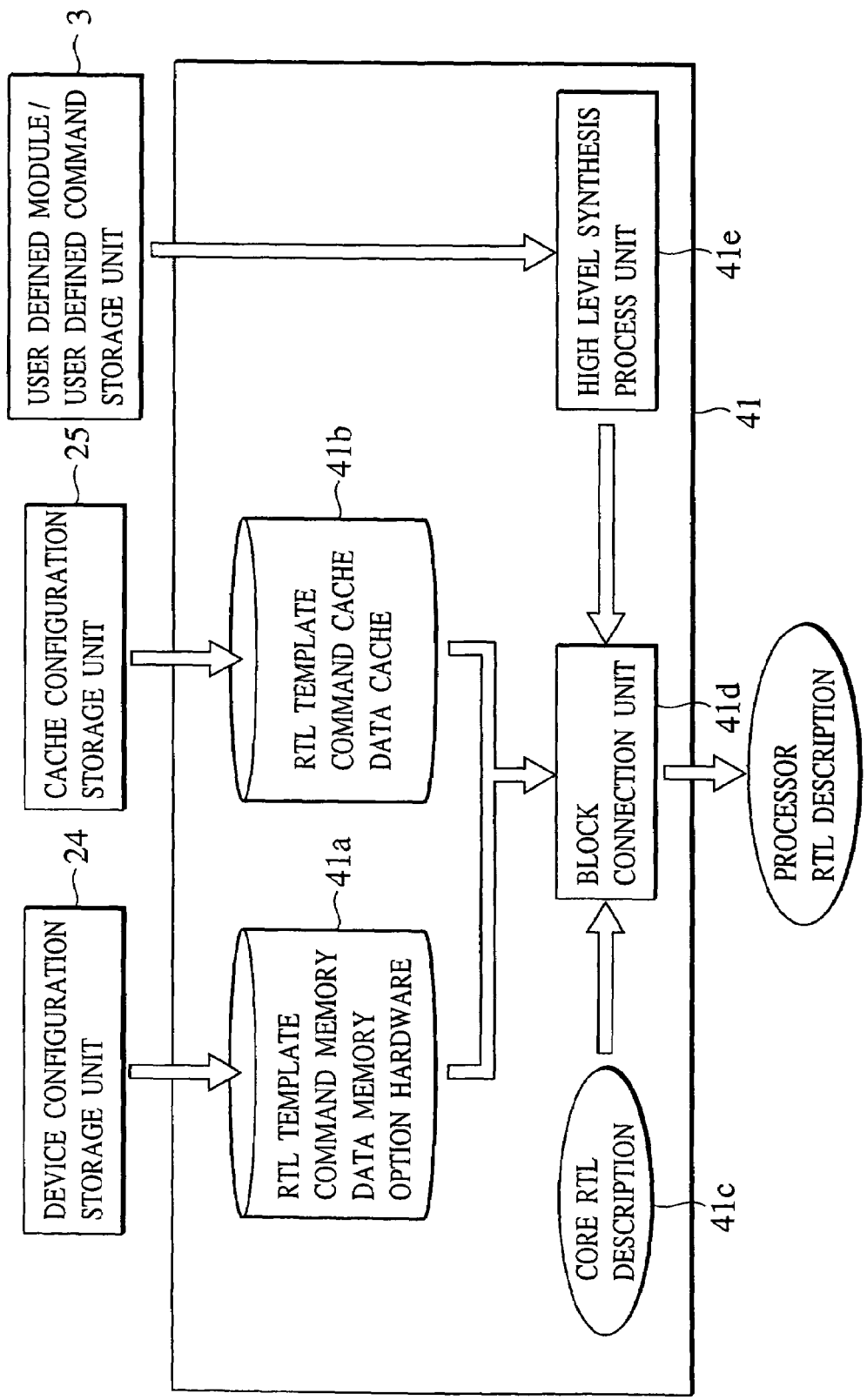
FIG. 6 is a view illustrating an operation of an RTL generating unit according to other embodiment of the present invention.

Specifically, as shown in FIG. 6, a block connection unit 41d selects some RTL templates 41a and 41b that correspond to the user set configuration by referring to the configurations stored in the device configuration storage unit 24 and cache configuration storage unit 25. Then, this connection unit generates processor RTL description by connecting the selected RTL templates to an RTL description 41c at a processor core unit and by connecting an RTL description generated by a high level synthesis unit 41e from a behavior level description that defines user defined instructions or user defined modules stored in the user defined module/user defined instruction storage unit 8 to the RTL description 41c at a processor core unit. In the case where the specification of user defined modules in the storage unit 8 is an RTL description, connection is made so that an interface signal coincides with another without doing high level synthesis.

In the case where a multiprocessor configuration is defined, a block connection unit 41d generates a plurality of processor descriptions, and generates an RTL description of the multiprocessor having these descriptions connected to each via a bus.

In addition, with respect to the instruction memory, data memory, optional hardware, instruction cache and data cache contained in the RTL templates 41a and 41b, all the RTL descriptions for each of the user selectable memory size are preserved in advance so as to selectively connect RTL descriptions to each other according to the specified configuration. With respect to optional instructions, hardware templates that correspond to the optional instructions are preserved for all combinations of ON/OFF of the optional instructions.

Figure 7:
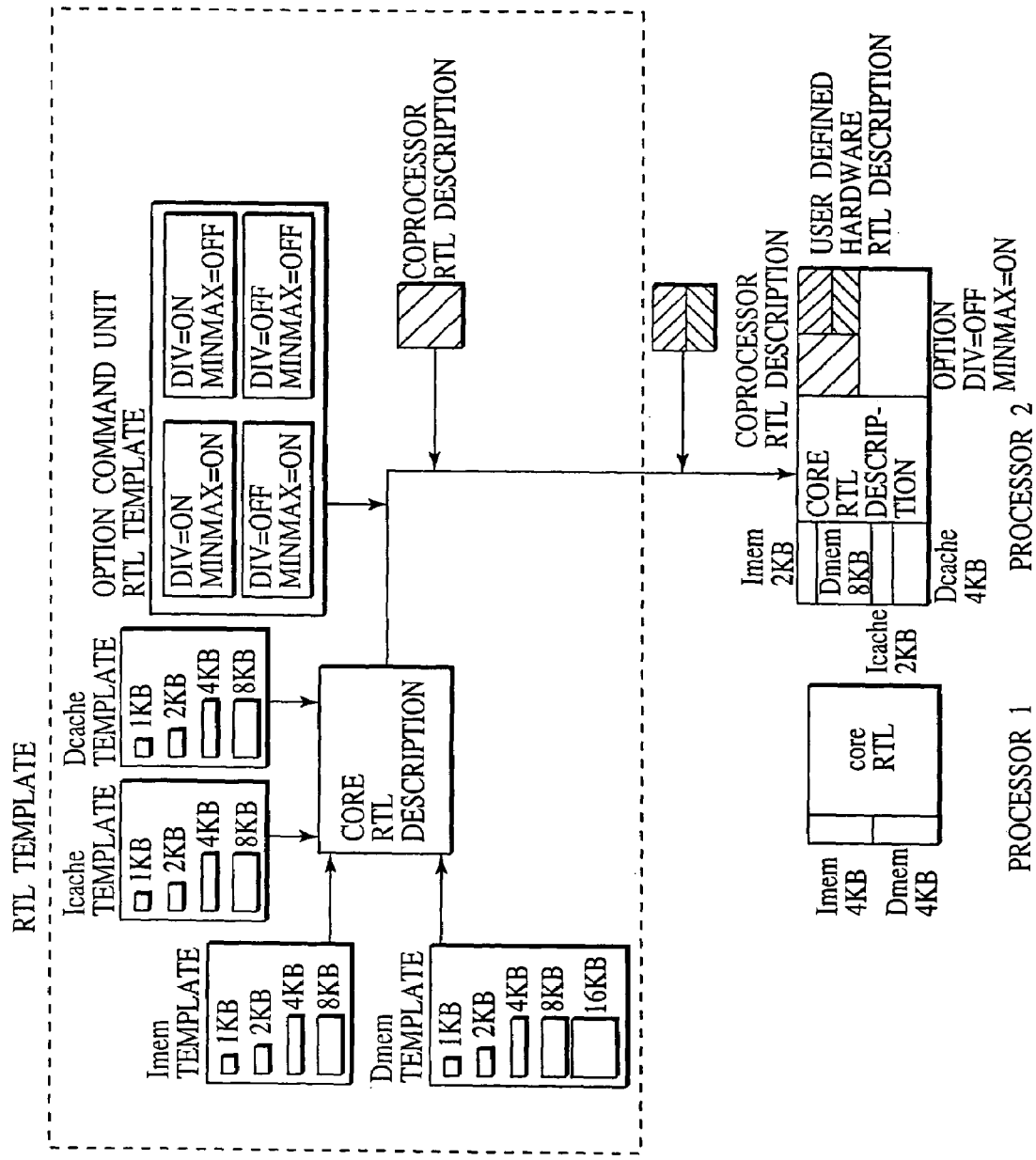
FIG. 7 is a view illustrating an operation of an RTL generating unit according to other embodiment of the present invention.

For example, in an example shown in FIG. 7, with respect to four combinations of ON/OFF of each of a divide option instruction (DIV) and a maximum/minimum value option instruction (MINMAX), the RTL descriptions of an instruction function unit for those four combinations are preserved as templates, respectively, to be selectively connected to each other according to the configurations stored in the device configuration storage unit 24 and cache configuration storage unit 25. In addition, with respect to optional hardware such as coprocessor as well, in the case where "Valid" is specified for a coprocessor item in configuration, the given RTL descriptions of the coprocessor are connected to the core processor RTL description. Further, in the case of the user defined hardware, the user described hardware descriptions are connected to the core processor RTL description each other.

Through the above connection processing, the RTL generating unit 41 generates the processor RTL description that corresponds to the set configuration. For example, in the case where a user will construct a processor in which 4 KB instruction memory and 8 KB data memory in the first trial, the user can automatically get the processor RTL description merely by specifying the configuration parameters. In addition, even in such a complicated case where the user re-construct the processor by changing the sizes of the instruction memory and data memory, adding the optional instruction and user defined instruction, and in case of adding another processor, processor No. 2 having some optional instructions and user defined instructions, the user can get the RTL description of the new processor merely by changing the configuration parameter, and supplying the hardware RTL description that corresponds to the user defined instruction. In addition, a same advantageous effect can be achieved in a different manner. Instead of using prepared multiple RTL templates, the RTL generating unit 41 has one RTL template in which change items are expressed as parameters, and it can generate th RTL description by setting the values specified in the configuration into the parameters in the template. Further, such parameter expressed RTL template may be sub-module such as memory or cache, or may be the entire processor containing them. Furthermore, the template may be one RTL template containing all parameters corresponding all change items.

<Configuration of Simulator Customizing Unit>

A simulator customizing unit 42 generates a simulator that executes an instruction operation in accordance with a configuration.

Specifically, as shown in FIG. 8, a re-compiling unit 42c incorporates in a simulator template 42a the C model of the user defined hardware stored in the user defined module/user defined instruction storage unit 3, and performs re-compilation, thereby reconstructing the simulator. In addition, a startup option information extracting unit 42d generates a simulator startup option file (See FIG. 9A) specifying startup options by referring to the data stored in the device configuration storage unit 24 and cache configuration storage unit 25 contained in the setting file generating unit. Then, a combination processing unit 42e generates a simulator that executes an instruction operation in accordance with the configuration by combining the reconstructed simulator and simulator startup option file with each other.

It is desirable that the above simulator comprises means for outputting the execution result of a debug directive when the simulator encounters a specific address. Conventionally, if an error occurs during execution, an assertion program for outputting such error or the like is present. However, in order to investigate processing in progress when the program executes processing normally, there has been only two ways, i.e., embedding an instruction for outputting processing in progress or stopping execution by a debugger or the like, thereby reading processing in progress. Predetermined information is outputted when the simulator encounters an address specified during startup, thereby making it possible to investigate processing in progress while an application is executed by a simulator. For example, the simulator is started up by the following instruction.

sim -load test.hex -printx mem (0x400) at 0x1200

Where, sim denotes a command for simulator, -load test.hex denotes a directive for loading and executing test.hex, -printx mem (0x400) at 0x1200 denotes a directive for outputting in a hexadecimal notation the contents of an address 0x400 of a memory when the simulator execute the instruction at the address 0x1200.

A simulator stores these directives, and outputs the contents of the address 0x400 to a console in a hexadecimal notation every time a program counter passes the address 0x1200. At this time, code for observation is not embedded in an application program, and thus, observation can be performed without affecting statistical information such as number of instructions or number of cycles at all. In addition, there is no need to stop execution at a specific address, read values in memory and display them to the console manually. Thus, a user can execute application program simulation, observing precise statistical information, checking a specially remarked processing in progress simultaneously, thus efficient LSI development become possible.

The next line is another example specifying memory length:

sim -load test.hex -printx mem (0x400) length 8 at 0x1200

In addition, it is desirable a simulator stops execution if a memory access in a region other than specified regions occurs. When the simulator is started up in accordance with the set configuration, information of available memory areas is securely provided. If a memory area having no corresponding physical memory mounted on a working substrate is accessed, a bus error occurs, and the subsequent operation is not guaranteed. A program whose operation is not guaranteed must be modified at an earlier stage by pointing out a mistake during execution of the simulator. The simulator is given information about memory areas corresponding actual memory, disables access to areas that are not explicitly specified as actual memory, and warns (and stops) if any illegal access occurs. In addition, the simulator has an interactive mode, and users can switch to the interactive mode (debug mode), and users can analyze what is the cause of an error using the simulator. Further, in the case where the simulator operates in communication with the debugger, it cancels a simulation operation, and waits for debugger instruction entry, outputs an error indicating access to an invalid region, and conveys a program error to a user earlier and certainly. In addition, in a decoding circuit in memory, there may be no connection of the upward address signal line s. In this case, even if a program that access illegal address is executed in the target, a bus error does not occur. However, in the case of a write access, the contents of an address are unintentionally rewritten, and the subsequent execution result may become unexpected. Even in the case where this incorrect program is executed by the RTL simulator, such error cannot be found immediately. Alternatively, when precise memory map information is supplied to the simulator so as to make the simulator access only correct address, if the user is warned immediately of the fact that an address outside the specified range has been accessed, the user finds out such incorrect program earlier, whereby a time for wasteful analysis can be eliminated, and a development cycle can be reduced.

For a debugger, a debugger startup option file as shown in FIG. 9B is generated by referring to the data stored in the device configuration storage unit 24 and cache configuration storage unit 25. The debugger can perform operation in accordance with a configuration by using the debugger startup option file.

In addition, it is desirable that the debugger has means for reading out statistical information data contained in the simulator as a virtual register or variable. The debugger has a variable "$profile" reserved as a specific variable. Statistical information is managed for each region. Then, the statistical information is displayed by a debugger variable readout instruction "print". In order to display third information in the region, "print $profile [3]" is inputted.

```
dbg> print $profile[3]
profile3:Count=7 Inst=123 Cycle=145
dbg>
```

Further, it is desirable that a compiler and a linker have means for outputting debug directives for a simulator as debug information in addition to symbols or source lines together with address (this is not reflected in a target machine instruction). An extension is applied to the compiler so that the simulator or the like can output processing information in progress. A statement following "#pragma cosoleout" is not embedded target machine code, and is stored as debug information like symbol name or line number in an object file. When the simulator reads the object file with debug information, it stores address information having a "#pragma" statement, and stores a statement "printf ("a=% d¥n", a) as debug output information. When the simulator is going to to execute the code placed at the address, it judges that debug information must be outputted, passes the "printf" statement to a purser, and outputs debug information.

In this way, debug information is outputted during simulation execution without affecting a target machine code, and the contents of memory can be checked without canceling simulator execution. At this time, statistical information acquired during simulator execution is identical to information acquired when the target machine code is executed on the target machine. In other words, the same object codes can be used on the target machine and by the simulator. Therefore, a development cycle can be also reduced because a recompilation due to a difference in execution environment doesn't occur. In addition, the same object file can be shared; therefore, it is obvious that the management is facilitated.

```
func(int b){
float a;
for(I=1;I<20; i++){
    A=b/I;
    #pragma consoleout printf("a=%d¥n",a);
}
```

<Configuration of Compiler Customizing Unit>

A compiler customizing unit 43 generates a machine instruction function declaration header file as shown in FIG. 9C, including machine instruction function declarations by referring to the data stored in the option information storage unit 23 and user defined instruction module/user defined storage unit 3. The machine instruction function declaration used here denotes a function declaration of a high level language in order to directly specify processor specific instructions and use them in the programs written in the high level language.

Figure 10:
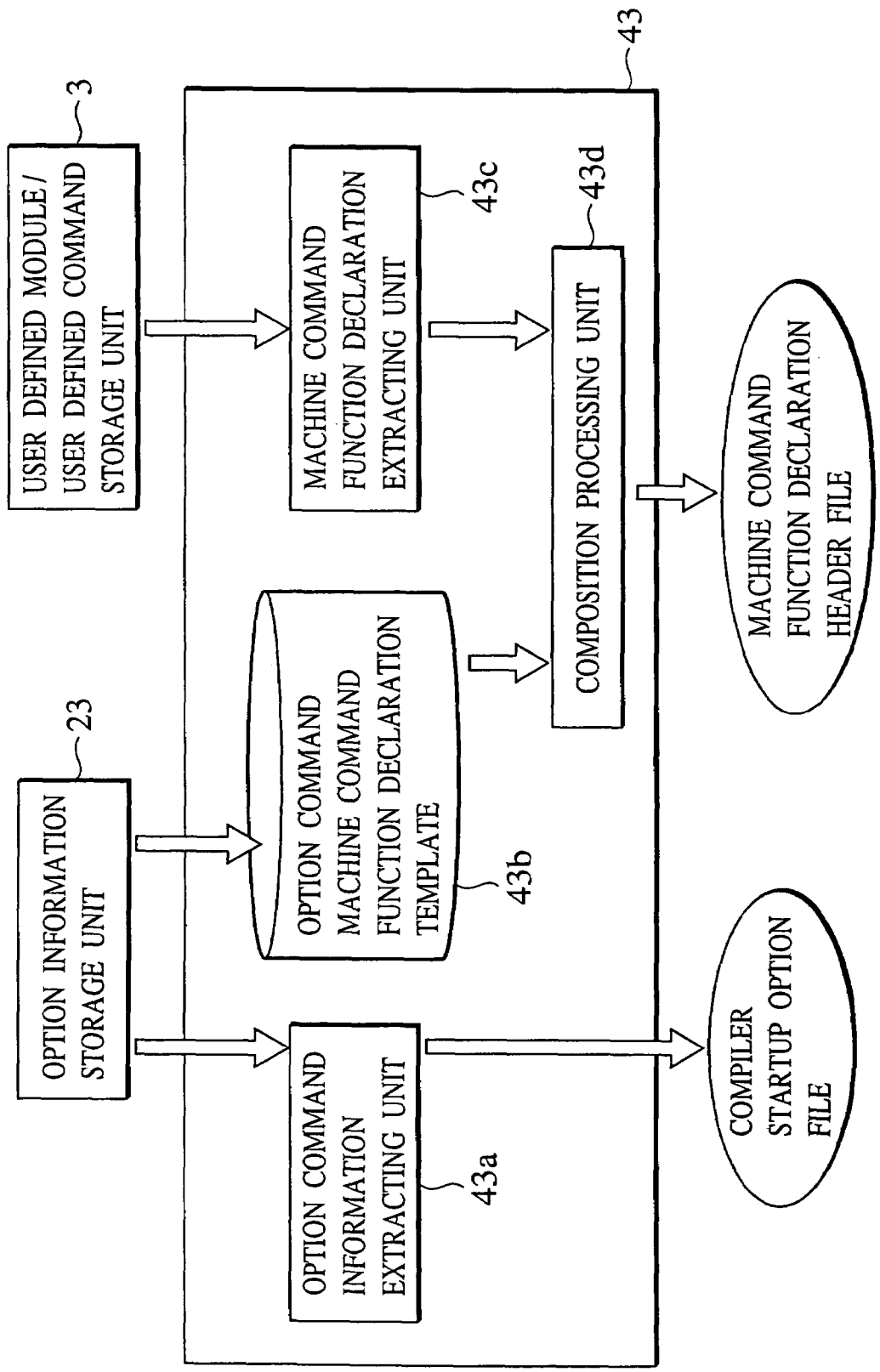
FIG. 10 is a schematic view illustrating an operation of a compiler customizing unit according to other embodiment of the present invention.
Figure 14:
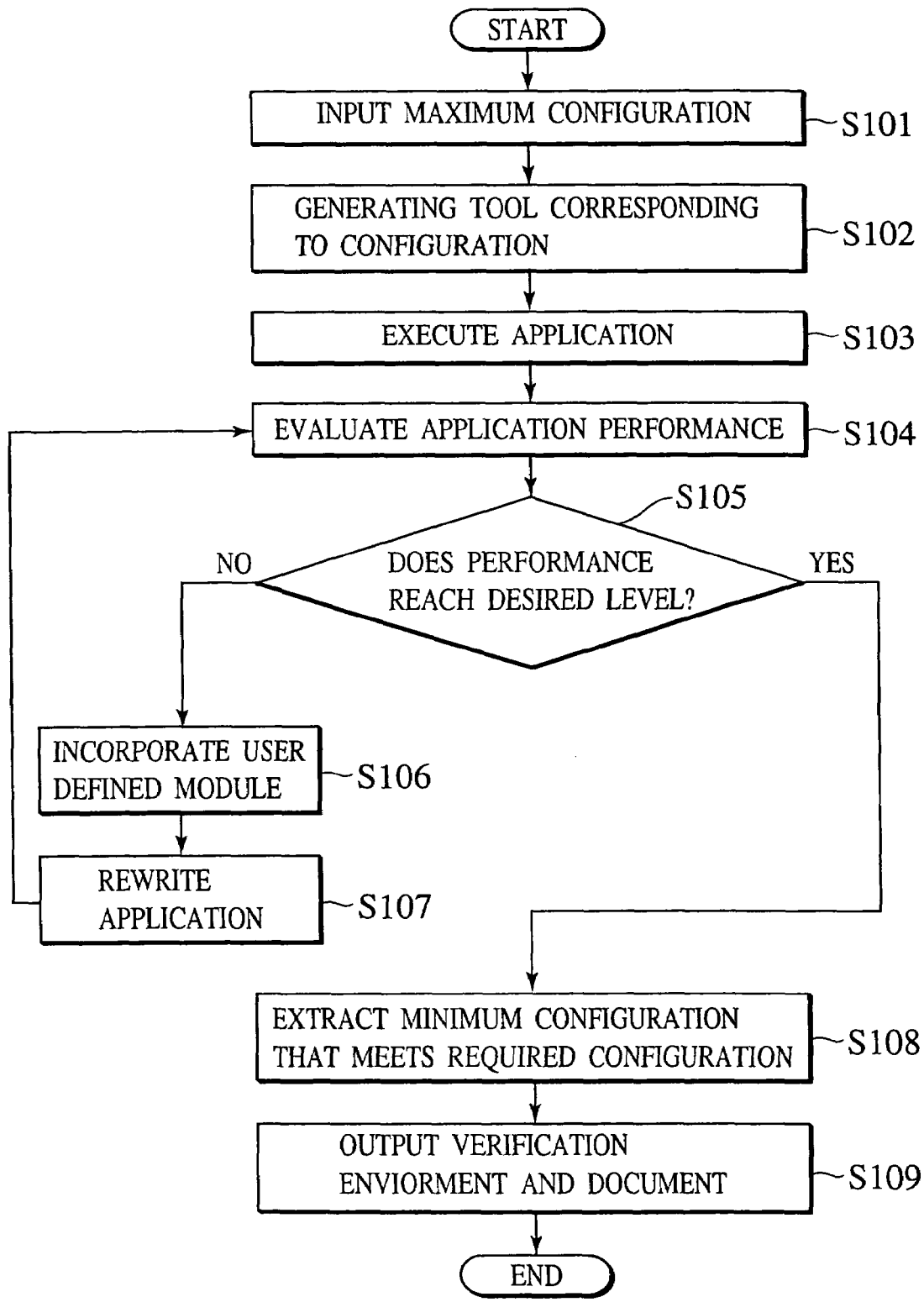
FIG. 14 is a flow chart illustrating system LSI development process using a system LSI development apparatus according to other embodiment of the present invention.
Figure 19:
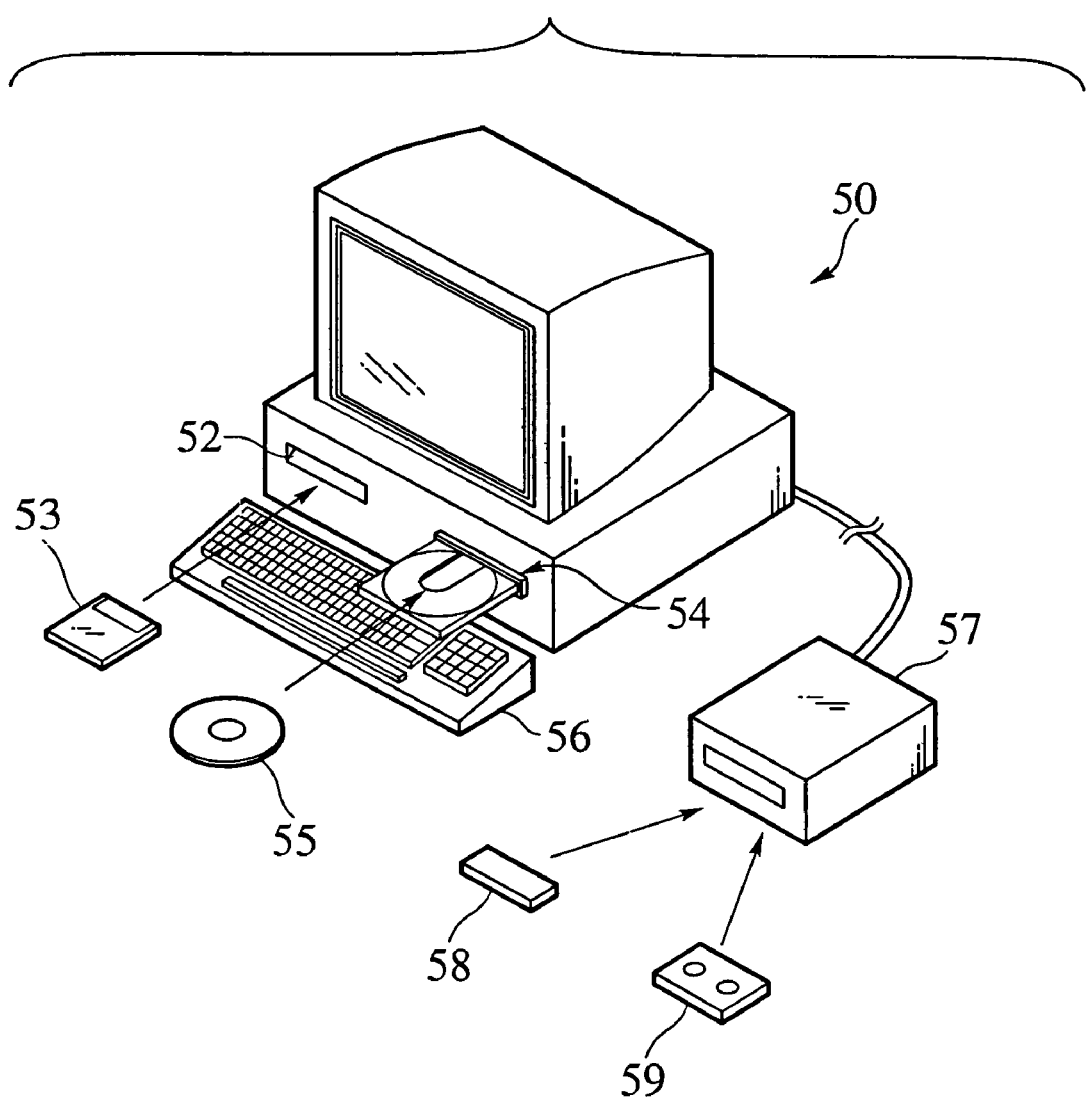
FIG. 19 is a schematic view showing an outline of a system LSI development apparatus according to other embodiment of the present invention.

Specifically, as shown in FIG. 10, a machine instruction function declaration extracting unit 43c extracts a corresponding machine instruction function declaration from the user defined instructions stored in the user defined module/ user defined command storage unit 3. In addition, a mergence processing unit 43d selects machine instruction function declarations that correspond to valid option instructions from the already defined template 43b by referring to the data stored in the option information storage unit 23. Then, the mergence processing unit 43d merges the machine instruction function declarations extracted from the template 43b and machine instruction function declaration extracting unit 43c, respectively, with each other, thereby generating a machine instruction function declaration header file. This machine instruction function declaration header file includes machine instruction function declarations that correspond to the optional instructions and user defined instructions that are valid in the configuration.

In this manner, the user can directly use the option instructions and user defined instructions specified in the configuration in programs written in a high level language.

The compiler customizing unit 33 has an optional instruction extracting unit 43a. This optional instruction extracting unit 43a acquires optional instruction information that is available for compiler's optimization by referring to the data stored in the option information storage unit 23, and generates a compiler startup option file (See FIG. 11A) for specifying options during compiler startup.

In this manner, available optional instruction information can be reflected for compiler optimization. In addition, function libraries are recompiled from source code by using a startup option file, thus making it possible to generate libraries having available option instructions incorporated therein.

<Configuration of Assembler Customizing Unit>

An assembler customizing unit 44 incorporates information about available optional instructions and information about mnemonics and instruction format of user defined instructions therein, thereby reconstructing an assembler. The assembler generated by this assembler customizing unit 44 can generate an object code from an assembler program that consists of an arbitrary combination of all the available instructions in the configuration.

<Configuration of Verification Vector Generating Unit>

A test vector generating unit 45 generates test vectors for verifying a configuration of a specified system LSI in an exhaustive manner, by referring to the configuration in each storage unit contained in the setting file generating unit 2. If the system LSI is large-scaled, it is required to importantly verify only modules changed from a basic configuration in order to terminate verification within a limited period of time. Thus, the verification vector generating unit desirably generates a family of the test vectors that correspond to instructions depending on the change of the configuration so as to importantly verify a module related to newly specified optional instructions or a cache memory whose size has changed and the like (FIG. 11B shows an example of a user defined instruction file for generating test vectors).

"Configuration of Performance Evaluating Unit"

A performance evaluating unit 5 makes an estimate of an application code size, the number of executed instruction, the number of execution cycles, the number of gates and power consumption. Hereinafter, the performance evaluating processing by this performance evaluating unit will be described in detail.

-Evaluation of Application Code Size

A performance evaluating unit 5 can evaluate an application code size. Now, assume that a C language program as shown in FIG. 12A is present as an application. The application shown in FIG. 12A can be compiled as follows by using a compiler generated by the system LSI development environment generating unit 4:
>SLIDE_cc test.c where SLICE_cc, test.c denotes a compiler startup command and a name of an application program file user created.

Then, information concerning a code size of the application can be obtained from an object file obtained as a result of compilation. In the case of the C program shown in FIG. 12A, the code size is 62.

Although there is shown an example in which an application is described in C language, the system LSI development environment generating unit 4 can generate an assembler. Thus, the application may be described in an assembly language (or may be mixed in the C and assembly languages). In the case where an application is described in an assembly language, an object file is obtained as a result of assembling. In addition, an application program is allocated on a ROM, and thus, the sufficient ROM size depends on code size of the application program and data size of variables with its initial value. The ROM size is generally 2 to the "n"th power KB like 128 KB or 256 KB ("n" denotes a natural number). Thus, in the case where the code size is present at the boundary of the above, if a user changes the application program so as to be able to be allocated in a ROM of its small size, the sufficient ROM size is reduced, resulting in cost reduction. For example, in the case where the code size is 130 KB, the ROM size is 256 KB. However, if the application is modified so that the code size is 128 KB or less, the ROM size can be 128 KB, resulting in cost reduction.

In addition, the system LSI development environment generating unit 4 can generate a simulator, and thus, can simulate the execution of an execution file by using the generated simulator. The simulator not only displays the simulation result, but also counts instructions executed during simulation, thereby making it possible to count the number of executed instructions in the entire application. For example, the execution file obtained as a result of compilation of a program shown in FIG. 12A is named "test", and this execution file "test" is applied to a simulator (simulator startup command is SLIDE_sim), whereby the program execution result (result=450) and the number of executed instructions (704) can be obtained like:

>SLIDE_sim test
result = 450
Program stop. Number of executed instruction: 704

The number of executed instructions can be obtained merely by counting executed instructions without considering their type, and thus, can be counted within a short time. In this way, the user can know application performance roughly within a short time, resulting in a reduced LSI design cycle.

-Evaluation of Summation of Instructions Executed from the Start to the End of Application Execution (Number of Executed Instructions)

A performance evaluating unit 5 can count the exact number of cycles of the entire application by counting th number of cache miss during application execution and counting the number of cycles for each instruction executed. For example, an execution file obtained as a result of compilation of program shown in FIG. 12A is named "test", and this execution file "test" is input to a simulator (its startup command is SLIDE_sim), whereby the program execution result (result=450 and the number of execution cycles (1190) can be obtained like:

> SLIDE_sim test
result = 450
Program stop. Number of execution cycles: 1190

Based on this performance estimation, the user can know whether the LSI performance is sufficient or insufficient, and the user can change a configuration easily, resulting in a reduced LSI design cycle.

In addition, when the performance evaluating unit 5 finds instructions that denotes the start point and end point of counting the number of executed instructions in an application program, it counts the number of executed instructions between two points in the application program.

In the case where an attempt is made to count the number of executed instructions in a "for" loop, which is inner one, in the program shown in FIG. 12A, a user writes instructions into the program as shown in FIG. 12B. When a compiler compiles the program shown in FIG. 12A, each of address corresponding to _START and _END is stored so as to count the number of executed instructions between these to addresses stored during the simulation. The number in brackets following _START, _END indicates a correlation between _START and _END. If these numbers are same, these START and END is a pair of two points. As the simulation result of application shown in FIG. 12B, as shown in FIG. 13A, the number of executed instructions in the inner loop (interval of number 1) is obtained to be 370.

Thus, a time for counting the number of executed instructions can be reduced by limiting the counting interval. In particular, in the case where an attempt is made to know the number of executed instructions in a loop in which the processing contents are not changed whatever a loop variable value may be, a user may specify that loop as a measurement interval, and the user stops the simulator when the first loop is terminated, counting time can be reduced. In this manner, the users can get the number of executed instructions only at a specific part of an application, and there is provided means for searching modified parts of an application as well as reduction of the LSI design cycle caused by reduction of the counting time.

-Evaluation of Summation of the Number of Cycles (Number of Execution Cycles) Executed from the Start to the End of Application Execution A performance evaluating unit 5 can execute counting the number of execution cycles. Specifically, a method for specifying an interval is similar to a case of the number of the above executed instructions. For example, in the case where an attempt is made to count the number of execution cycles in a "for" loop, which is inner one, in the program, as shown in FIG. 12B, _START and _END are described before and after the "for" loop. As a result, the simulation result shown in FIG. 13B is obtained. This processing results in a reduced time of counting the number of execution cycles, and there is provided means for searching modified parts of an application as well as reduction of the LSI design cycle caused by reduction of the counting time, and further, is executive means for deciding cache size.

In addition to a user specified interval, the number of executed instructions and the number of execution cycles may be outputted when a specified point is passed. In this manner, the user can know the number of executed instructions and the number of execution cycles from the start of execution of application to an arbitrary point. For example, assume a case in which an attempt is made to know the number of executed instructions at a time when a loop in a function called in a "main" function terminates. At this time, in the number of executed instructions as in embodiments 4 and 5, an interval cannot be specified across functions, and thus, the number of executed instructions cannot be known from the start of application. If an arbitrary point on a program is specified instead of interval specification, this problem is eliminated. The simulator holds the specified point and may output the number of executed instructions from the start of application to a time when the address of that point is passed.

First, assume a case in which located in the specified address is an instruction other than conditional branch instruction, for example, an "add" instruction for performing addition. The simulator can output the number of executed instructions from the start of application before or after executing this "add" instruction. The user can make selection of before or after executing the "add" instruction.

Next, assume a case in which a specific address is a conditional branch instruction, for example, a beq instruction. The "beq R1, R2" and LABEL1 instruction is used to branch to an address given LABEL1 when the values of registers R1 and R2 are equal to each other. When these values are not equal, the next instruction of the branch instruction is executed. (Here, assume that the branch instruction has no latency). The simulator can output the number of executed instructions from the start of application both when the conditions of this "beq" instruction is met and not met (branch is taken or not taken). The user can make selection of whether or not condition is met or is not met.

-Evaluation of Power Consumption and the Number of Gates

The performance evaluating unit 5 serves to calculate power consumption or a value that can be converted into the power consumption by a commercial available tool such as WattWatcher by referring to the RTL description outputted from the system LSI development environment generating unit 3. In addition, the number of gates or a value that can be converted into the number of gates is calculated by using RTL description. Information concerning the number of gates is extracted, wherein an optimal chip size can be determined, and the cost of producing LSI can be reduced.

The performance evaluating unit 5 can calculate a cache miss rate (or hit rate) by using the RTL description, compiler and verification environment generated by the system LSI development environment generating unit 4. For example, the value as shown in FIG. 13C can be obtained as a result of estimation of cache performance relevant to a target application. As a result, in the case where there is no limitation to cache size and an attempt is made to reduce the execution time of the target application, 16 Kbytes that results in the lowest in cache miss rate can be set as cache size. In the case where there is limitation to cache size, tradeoff relevant to change of the execution time of a target application together with change of a cache miss rate is considered.

In addition, the performance evaluating unit 5 desirably serves to maintain internally estimate information such as power consumption or the number of gates of RTL obtained based on the generated RTL, compiler, simulator, and verification environment or estimate information such as number of executed instructions or number of cycles in application found as a result of simulation. In the case where the user attempts to browse these items of information, all information can be browsed. However, in this tool, a user desired item (highest priority item) is specified, whereby that item can be automatically browsed. For example, in the case where the user attempts to know chip size as estimate information, this tool computes a chip size from the generated RTL, and provides the chip size to the user by specifying the chip size as the highest priority item. In the case the user attempts to know the number of application execution cycles, the number of execution cycles found from the result of simulation is provided to the user.

With such arrangement, a user desired estimate information is conditionally specified, whereby the estimate information is automatically obtained so that judgment of estimation can be performed rapidly.

The performance evaluating unit 5 can translate cycle information produced as a result of RTL simulation into information for simulator input. For example, there are some types of memory accesses. The numbers of access cycles are different by memory type such as ROM and RAM. In this case, although the simulator can set the number of cycles roughly, this does not follow actual value. In order to correct the value, the cycle information as the result of execution simulation in RTL is used. The simulator reads RTL simulation cycle information or information obtained by converting cycle information into simulator input format, making it possible to change the simulator internal value. In this manner, more precise estimation can be performed.

"Configuration of Termination Judgment Unit"

A termination judgment unit 6 judges whether or not the designed system LSI meets the target performance the user set in advance, based on the performance evaluating result obtained by the performance evaluating unit 5.

In the case where the target performance is not met, the change item setting unit 7 derives the subsequent settings based on the evaluation result obtained by the performance evaluating unit 5.

"Configuration of Change Item Setting Unit"

A change item setting unit 7 derives the subsequent configuration settings based on the evaluation result obtained by the performance evaluating unit 5. This unit has access statistics relevant to memory areas and the number of access cycles as statistical information for performance evaluation. In addition, in the case where a cache is provided, a cache hit rate is provided as statistical information.

The statistical information obtained by executing a target application is used as information for performance evaluation, thereby making it possible to derive the settings of the variable values along the characteristics of the target application.

The memory areas (such as ROM, RAM or cache) are classified based on their number of access cycles, and the access statistics of the memory area and a unit for counting the number of cycles are separated from each other.

The access statistics and counting the number of cycles are separated from each other so that computation for correcting the number of cycles is performed only when necessary. Here, assume a case in which a target performance cannot be obtained once in a system with cache. In the case where it takes a larger number of machine cycles to run the target application and therefore an attempt is made to reduce the number of the machine cycles, as a means for evaluating performance, a variable value is set with reference to the information on access statistics in accordance with a template of the integrated development environment available for reducing the number of the machine cycles, e.g., increasing cache size.

(Template)

A large number of cycles—A large number of memory access cycles—High cache miss rate—ANS: Increasing cache size—The other reason (omitted)

In this manner, memory areas are classified by access cycles, and each area has statistical information, whereby more precise estimate can be obtained. In addition, evaluation is performed based on statistical information during execution of the target application, whereby more suitable variable value settings can be derived. In addition, a development time can be reduced by providing means for automatically introducing variable value settings.

In addition, the change item setting unit 7 desirably has statistical information on optional instructions as a result of executing the target application. Then, by using this statistical information, reorganization can be obtained in a configuration from which unused optional instructions are removed. As an example, assume a case in which an optional instruction of 32 bit multiplying and adding operations is supplied, thereby configuring an LSI. The statistical information during execution is obtained by running the target application in this environment. As a result, it is found that an option instruction of 32 bit multiplying and adding computation is not used for target application. Then, a configuration in which such option instruction is set OFF is derived as a feedback from the performance evaluation, the settings are changed, and reconfiguration is performed. Thus, the setting or reconfiguration for removing instructions can be automatically performed, thereby making it possible to reduce a development time and a cost.

Further, the change item setting unit 7 has means for derives the subsequent variable value settings based on the evaluation result. In addition, it is desired that statistical information on optional instructions obtained as executing a target application is provided as statistical information for performance evaluation. In this manner, the statistical information is used so that the item settings can be performed for a reconfiguration into an option configuration in which instructions with lower number or rate of appearances than that of predetermined has been removed. As an example, assume that an LSI is configured together with 32 bit multiplying or adding computation option instruction. With this configuration, a target application is executed, and statistical information during execution is obtained. As a result, it is found that the use frequency of optional instruction for 32 bit multiplying and adding computation is equal to or smaller than a predetermined number or rate of appearances. Thus, a configuration in which that optional instruction is set to OFF is derived as a feedback from performance evaluation, performing reconstruction. A compiler performs compilation without using that option instruction. Thus, instruction reconstruction, compiler reconstruction or automatically setting change can be performed, thereby making it possible to reduce a development time and cost.

Furthermore, the change item setting unit 7 desirably has means for executing a target application again, and judging validity of setting change after change item setting change has been automatically performed by performance evaluation. In addition, in the case where a target application is executed again, and the setting change is valid after change item setting change has been automatically performed by performance evaluation, it is changed to additional settings. A finite number of executions are repeated so that proper settings may be automatically selected in the obtained result.

"Configuration of Input/Output Interface Unit"

An input/output interface unit 8 has a function for supporting information input/output processing among the system LSI development apparatus 1, input unit 10, and output unit 11. For example, use of a graphical user interface (GUI) is considered. According to this input/output interface unit 8, even if a user is unfamiliar with a computer, the user can develop a system LSI easily in accordance with an instruction from the input/output interface unit 8.

"Configuration of Control Unit"

A control unit 9 controls constituent elements in the system LSI development apparatus 1 in accordance with the user instructions via the input/output interface unit 8.

<<Operation of System LSI Development Apparatus>>

Next, system LSI development processing using the system LSI development apparatus will be described here.

In developing a system LSI using the system LSI development apparatus, the user first inputs the maximum configuration concerning performance such as cache size to the system LSI development apparatus 1 (S101). When this configuration is inputted, the system LSI environment generating unit 4 in the apparatus 1 generates tools that correspond to all possible combinations of the configuration (S102), and the user executes an application after the completion of tool generation (S103). After the application has been executed, the performance evaluating unit 5 evaluates application performance by referring the execution result of the application (S104).

When the performance evaluation caused by the performance evaluating unit 5 completes, next, the termination judgment unit 6 judges whether or not the performance caused by the first configuration reaches a desired reference (S105). In the case where the judgment result is affirmative, the minimum system that meets th performance is calculated (S108), and the verification environment and documents are outputted to the user (S109). Assume that the documents include an item description for checking a specified configuration.

On the other hand, in the case where the performance is insufficient, the user designs user defined modules, and incorporates these modules in the development tools (S106). Then, the user rewrites an application so as to use the user defined modules (S107). Then, the user executes the application again, and judges whether or not the rewritten application meets a desired performance.

In the case where a user defined hardware module(s) is used, the estimation of the performance can be conducted by correcting the estimation having been obtained without the user defined hardware module or by replacing the estimation results as obtained without the user defined hardware during the estimation by values as specified by the user. In the case of the former method, i.e., when the estimation of the performance is corrected after the estimation having been obtained without the user defined hardware module it is possible to conduct the correction without modifying the existing profile estimation system and therefore to save the development time.

In the case of the later method, the estimation results are replaced by values as specified by the user during the estimation. Namely, each time when a function abc( ) has been executed, the statistical information as obtained therefrom is discarded and replaced by a fixed value, e.g., 3 cycles. Alternatively, each time when the function abc( ) is called, no operation is conducted but only 3 cycles are taken into account.

Needless to say, in this case, the accuracy of estimation is improved as compared with the accuracy of estimation utilizing average numbers. For example, as compared with the case where the number of instructions executed are variable due to branch instructions included in the software, the accuracy becomes high. If the values as specified by the user are interactively determined, rather than fixed values, appropriate values can be input for each call so that the accuracy may possibly be furthermore improved. However, the development time tends to increase since an operator has to stand by.

For example, the total number of instructions to be executed is calculated as 10000−20*(25−3) in the case where the function abc( ) is repeatedly called for 20 times; where the average number of instructions to be executed for executing the function abc( ) is 25; where the total number of instructions executed during evaluation is 10000; and where it takes three machine cycles as required to perform the corresponding operation in the hardware to the function abc( ).

In the following description, this example will be explained in details. In this case, an instruction is a machine instruction. Each instruction is executed in one cycle. The statistical information is obtained for each function. The information about "hw_cycle" as commented later is interpreted during a simulator is operating. Namely, the statistical information is cleared to input values as specified by the user during the estimation. Evaluation of each function is initiated when called while new statistical information is obtained when returned.

At first, the following source text is considered as a function to be replaced by a user defined hardware module.

```
int abc(int x){
    int    z=0;
    if (x !=0){
        z = x/3;
    } else { }
    return z;
}
void main(void){
    int    p,q;
    for(p=0;p<10;p++){
        q=abc(p);
    }
}
```

It is assumed here that the execution of the function abc( ) is completed by executing three instructions if the argument is 0 and executing six instructions if the argument is not 0. Accordingly, the statistical information of the function abc( ) is such that the function abc( ) is called for 10 times; the total number of instructions is 57; the average number of instructions is 5.7; the maximum number of instructions is 6; and the minimum number of instructions is 3.

In this case, the total number of instructions executed during execution of the function main( ) is 107. The number of instructions of the function main( ) itself is 107−57=50 consisting of 10* (assigning the argument, calling the function abc( ), counting up the index, evaluating the branch condition)=40 and other 10 instructions outside of the for loop.

The estimation of replacing the function abc( ) by a hardware can be conducted by the following method. Namely, in the case where the function abc( ) is replaced by a hardware which is capable of completing the operation in one cycle with the same number of the instructions required for calling the hardware operation, the estimated number of instructions of the function main( ) is 50. This is possible also after statistical operation.

Also, the estimation of replacing the function abc( ) by a hardware can be conducted by another method. Namely, in the case where the function abc( ) is replaced by a hardware which is capable of completing the operation in three cycle, the cycle as counted is cleared when returning from the function abc( ) and a cycle count as predetermined is used instead. Namely, the function abc( ) is expressed as follows.

```
int abc(int x){
    int    z=0;
    if (x !=0){
        z = x/3;
    } else { }
    return z;
    /* reset hw_cycle, hw_cycle = 3 */
}
```

In the case where the execution of the function abc( ) is completed by executing one instruction if the argument is 0 and by executing two instructions if the argument is not 0, the estimation of the function is not started when called while the statistical information is incremented by a value selected depending upon the case when called.

Namely, 1 is added if x=0 while otherwise 2 is added. In this case, the process at calling and returning can be dispensed with. Namely, the function abc( ) is expressed as follows.

```
int abc(int x){
    int    z=0;
    if (x !=0){/* hw_cycle = 2 */
        z = x/3;
    } else {/* hw_cycle = 1 */}
    return z;
}
```

The recording of the statistical information is instructed by macros, which are used to initiate recording and terminating as follows.

```
int abc(int x){
    PROFILE_START( );
    int    z=0;
    if (x !=0){
        z = x/3;
    } else { }
    return z;
    PROFILE_END( );
}
```

Also, in the case where the estimation of the performance is conducted by replacing the estimation results as obtained without the user defined hardware by values as specified by the user during the estimation, the recording of the statistical information is instructed by macros PROFILE_CLEAR( ), PROFILE_SET(n) and so forth.

(Example of Processing in which User Defined Module is Added)

Now, processing for adding the user defined module will be described by showing an example of processing adding a DSP as a user defined module. In this example, assume that, in an application, processing for reading out data from a memory, performing computation, and writing the result to the same address of the memory is repeatedly executed.

In this example, when application processing is executed by using only a core processor, the application executes a program as shown in FIG. 15A by using the processor instruction. However, the target performance cannot be achieved in this situation, and thus, a DSP for performing computation is added as a user defined module. Here, the DSP is controlled by means of a control bus, and the core processor may write a numeric value for controlling the DSP in the control bus. Although this processing is made possible by defining and using a DSP instruction, the DSP execution is assumed to be controlled by the control bus. Moreover, "_culc" shown in FIG. 15A denotes a subroutine for performing computation processing.

In addition, the DSP added as the user defined module operates in accordance with a program shown in FIG. 15B. That is, a computation data start address is placed in an address cntlbus_addr1 of the control bus, and a computation data end address is placed in cntlbus_addr2. In addition, placed in cntlbus_addr3 is a value of the location of a memory storing the computation result. Furthermore, a DSP operation is controlled by writing data in the address placed in cntlbus_addr4. Specifically, DSP processing is started or ended by writing 1 to a certain bit of data in this address. When processing is started, the DSP reads a start address, an end address, and an address in which the calculation result is to be written (cntlbus_addr1, cntlbus_adde2, cntlbus_addr3), and starts processing.

The following two methods for adding a user defined module such as DSP are used.

(1) Both of behavior level description and RTL description are created as user defined module specification, and are stored in a user defined module/user defined instruction storage unit 3; or (2) Only behavior level description is created, and RTL description is generated from behavior level description at the high level synthesis processing unit 41e in the RTL generating unit 41.

Here, the above behavior level description will be explained with reference to FIG. 15C and FIG. 16. DSP_HWEngine shown in FIG. 15C has HWEngine properties and control bus properties, and an operation model recognizes a DSP as HWEngine by class definition. In the case where DSP start or the like is written in the control bus, write_controlbus of DSP_HWEngine is called in accordance with the program shown in FIG. 16, and DSP processing is started. When the user attempts to describe an instruction for the DSP anew, a user defined instruction is described. Then, a system LSI development apparatus receiving configuration information creates an instruction definition header file, and supplies the file to a compiler. The compiler executes compilation processing, and outputs an execution object containing the user defined instruction. In a simulator or an RTL, in order to execute its operation, it is required to give its behavior level description. In addition, in the behavior level description shown in FIG. 16, do_command is called for requesting each command in a DSP_HWEngine class while each command is implemented in the description.

Performance evaluation is performed by using the user defined module added as described above. When the added module meets the performance, processing is terminated. If the module does not meet it, another user defined module is created and added. Software performance evaluation executes a user application, and checks whether or not the target performance is met. Hardware performance evaluation is used to perform logic synthesis to generate an RTL description in which the core processor and user defined module are connected to each other, and executes gate number counting, timing analysis, power consumption analysis or the like. Hardware verification verifies whether or not the vector execution result of an operation model (simulator) that consists of a core and a user module coincides with the RTL simulation result by employing a vector or the like created by handwriting or using a tool for generating a test vector.

(Processing Example of Multiprocessor Configuration)

Although the foregoing description gives an example when one processor in a system is provided, of course, it is possible to provide a plurality of processors in the system, and construct a multiprocessor configuration. In this multiprocessor configuration, it is possible to independently set variable set items such as option instruction or cache size. Hereinafter, a processing example of a multiprocessor configuration will be described with reference to FIG. 17 and FIG. 18.

In recent years, restoration processing of compressed data or data display processing and the like is likely to be substituted by software from the aspect of cost or speed, and software processing rate increases, and is complicated. In the case where a complicated application is defined as a target, when the target performance is not met even by defining a user defined module for one processor or even by providing a coprocessor, the multiprocessor configuration is employed. In addition, even in the case where a coprocessor is provided in order to improve a speed, a core processor must perform a number of processing functions such as loading data to the coprocessor. In addition, there is a case in which one processor clearly disables processing. In such case, assume that an application is executed by a plurality of processors.

Here, assume an application in which a compressed data stream is (1) received, (2) restored, (3) processed for display, and (4) data outputted. In stream processing, the processing time is predetermined, and thus, the processing speed is first important. In the case where these processes are performed by one processor, plurality of processing functions plus coprocessor or user defined module control must be performed, and the target performance cannot be obtained. In such a case, processors are assigned for processing functions so that such processing functions may be distributed. As an example, processing functions can be distributed so that processing functions (1) and (4) are performed by processor 1; processing function (2) is performed by processor 2; and processing function (3) is performed by processor 3. In addition, with respect to optional instructions or cache and the like, the settings can be provided to each of the processors so that "No instruction cache", "No data cache", and "No optional instructions" are set to processor 1; "instruction cache 2 KB", "data cache 1 KB", "DSP provided as user defined module", and "No coprocessor" are set to processor 2; "Instruction cache 2 KB", "No data cache" and "With coprocessor" are set to processor 3. That is, change item settings to one processing, as has been described above, can be provided to a plurality of processors. Then, the minimum configuration is obtained for each of the processors with applications for performing their processing functions using three processors, whereby an optimal LSI can be constructed. For example, although all processor instruction caches and data caches are first defined as 4 KB, it is found that the target performance can be obtained with the above configuration as a result of performance evaluation, and feedback from performance evaluation can be obtained for a respective one of the change items.

Also in the case of the multiprocessor configuration LSI, a system LSI development environment can be prepared by specifying a configuration in the same manner as a single processor configuration (however, in the case where a user defined module is present, a user needs to give behavior level description). Although there is no change to a multiprocessor, compilers are generated for individual processors one by one heterogeneously. The simulator, debugger or the like corresponding to the multiprocessor is generated. With respect to how to generate the multiprocessor simulator for system LSI development environment, as in the case where a single processor is used, a setting function is generated for each core by using a template in order to set and generate a processor (The program codes shown in FIG. 17 and FIG. 18 are generated by using a simulator generation template. The code shown in FIG. 17A is an example of a simulator core class.). A module assembling function (FIG. 18A) calls the set function (FIG. 17B) generated for each core. In this case as well, depending upon the configuration, the number of functions called differs from each other, and this function is generated by using a template. In addition, during execution of a simulator, as shown in FIG. 18B, the functions for advancing the operation by one step (or one clock) in the respective processors are called in the function for advancing the operation by one step (or one clock) in the multiprocessor system.

In addition, in an application, although inter-processor communication processing or the like is required as well, there are shared memory or intra-processor hardware interrupt or hardware semaphore and the like. In the above application, data obtained when computation terminates is written in a memory to exchange with another core. In order to notify one core of termination of a processing operation by another core, a hardware interrupt occurs relevant to that core as notified. Then, in order to prevent resource competition, a semaphore is used. There are templates in RTL in the same manner as templates for simulator, and RTL descriptions are generated according to the number of cores.

In this way, in the system LSI development apparatus according to the present embodiment, a system LSI design configuration is maintained in one database, and all of the RTL description, development tool and verification environment are consistently generated by referring to the information stored in this database so that a work load and time required for redesign caused by a configuration change can be significantly reduced. In addition, with such configuration, a design and evaluation process is repeated within a comparatively short time, thus making it possible to easily obtain a system with its configuration suitable to the user object. Further, the necessity of a user defined module is judged first by performing evaluation based on the maximum configuration settings, thereby making it possible to start for system LSI design early.

As has been described above, according to the system LSI development apparatus according to the present embodiment, with respect to all possible combinations of change item definition information containing at least one of the option instructions, user defined module and multiprocessor configuration, a plurality of the system LSI hardware descriptions containing a processor in which an option instruction has been defined; development environments; and development tools are consistently created in encyclopedic/parallel, thus, making it possible to develop a system LSI optimal to applications within a short period of time.

In addition, a configuration specified at one site is shared by each tool, and a plurality of the system LSI hardware descriptions, verification environments, and development tools are created in encyclopedic manner and in parallel with respect to a possible configuration combination, thus making it possible to obtain linkage between tools. Thus, a system LSI development period can be reduced. In addition, in the case of constructing a multiprocessor system, all the hardware local memory information is maintained in batch, and the local memory map of each processor is generated including an access region for the local memory of another processor, thus making it possible to contain a plurality of processors in the system LSI.

In addition, performance evaluation is executed in parallel for each of the configuration combinations. Thus, there is no need to intensively evaluate each tool output manually, and it is possible to reduce the development period of the system LSI. In addition, there is provided a function for estimating application code size, number of executed instructions, number of execution cycles, chip th number of gates and power consumption, the estimated performance and target performance are evaluated comparatively, thus making it possible to reduce a load work required for performance evaluation and reduce the system LSI development period.

In addition, a configuration item can be interactively set, thus making it possible to set a configuration without considering a configuration file syntax and providing settings within a short time as compared with a case of directly describing a configuration file. In addition, all the configuration items are set interactively, thus making it possible to prevent failure to set configuration items.

In addition, a compiler customizing unit 43 generates a compiler. Thus, the user can know the target application code size, making it possible to reduce the system LSI development period.

In addition, the simulator customizing unit 42 generates a simulator. Thus, the user can know the target application performance, and the development period of the system LSI can be reduced.

In addition, the performance evaluating unit 5 is used to extract the number of application execution cycles. Thus, the user can know whether or not LSI performance is insufficient, resulting in speedy configuration item change and reduced system LSI performance period.

Further, the performance 5 is used to extract the number of gates, thus making it possible to determine an optional chip area and suppress an LSI manufacture cost.

Further, configuration setting and the associated performance evaluation can be provided based on a user specified variable value, thus making it possible to obtain the result corresponding to a plurality of settings at the same time. Thus, the LSI development cycle can be reduced.

Furthermore, the system LSI development highest priority items can be specified, and a configuration optimal to priority items can be estimated without considering a configuration.

Still furthermore, memory areas are classified with reference to the access cycles, statistical information is provided to each region, and more precise estimation can be performed.

Furthermore, the target performance can be set, and the estimation along the target performance can be derived. In addition, in the case where the application does not reach the target performance, a configuration item is changed (feedback) based on information recorded during application execution, thus making it possible to extract a configuration suitable to the target performance. Further, the development environment and verification environment is regenerated based on automatically changed configuration items, and application execution performance is measured and is compared with the target performance, thereby making it possible to judge setting change validity. Furthermore, in the case where it is judged that the setting change is invalid as a result of such validity judgment, a configuration item is automatically changed again, and the application execution performance is measured again. In addition, the validity of configuration item setting change is judged, and thus such change can be made by the finite number. Thus, the system LSI development period can be reduced.

OTHER EMBODIMENTS

A system LSI development apparatus according to other embodiments of the present invention comprises a so called general-purpose machine, a workstation, a PC (Personal Computer), and an NC (Network Computer) or the like. This system has its appearance shown in FIG. 19, for example, and comprises a floppy disk drive 52 and an optical disk drive 54. Then, a floppy disk 53 is inserted into a floppy disk drive 52; an optical disk 55 is inserted into an optical disk drive 54; and predetermined readout operation is performed, whereby programs stored in these recording media can be installed in a computer system. In addition, a predetermined drive device 57 is connected, whereby installation or data reading and writing can be executed by using a ROM 58 that serves as a memory device or a cartridge 59 that serves as a magnetic tape.

In addition, the system LSI development apparatus according to the embodiments of the present invention may be programmed and stored in a computer readable recording medium. Then, in performing system LSI development processing, this recording medium is read by a computer system; a program is stored in a storage unit such as memory incorporated in the computer system; and a system LSI development program is executed by a computing device, whereby the system LSI development apparatus and method according to the present invention can be executed. Th recording media used here comprises a computer readable recording media capable of recording, for example, a semiconductor memory, a magnetic disk, an optical disk, a magneto-optical disk, a magnetic tape, and a transmission medium.

What is claimed is:

1. A processor, comprising:
   a processor core; and
   a memory operatively coupled to said processor core;
   wherein said processor core is designed using a method comprising:
      selecting a cache size from given candidates;
      selecting an instruction memory size from given candidates;
      selecting a data memory size from given candidates;
      selecting a plurality of option instructions that are provided respectively in correspondence with machine instructions to be implemented within said processor core and provided in general-purpose language and described in both RTL description and in one of behavior level description or C/C++ model description.

2. The processor according to claim 1, wherein said option instructions include a dividing option instruction (DIV) and a maximum/minimum value option instruction (MINMAX).

3. The processor according to claim 1, wherein said processor core is provided with an instruction cache and a data cache.

4. The processor according to claim 1, wherein said cache size, said instruction memory size, said data memory size, and said option instructions are provided in RTL templates accessible by the processor core.

5. The processor according to claim 1, wherein said method further comprises selecting optional hardware associated with said processor core.

6. A system LSI, comprising:
   a processor core;
   a memory operatively coupled to said processor core and a user defined module;
   wherein said processor core is configured using a method comprising:
      selecting a cache size from given candidates;
      selecting an instruction memory size from given candidates;
      selecting a data memory size from given candidates;
      selecting of a plurality of option instructions that are provided respectively in correspondence with machine instructions to be implemented within said processor core and provided in general-purpose language and described in both RTL description and in one of behavior level description or C/C++ model description.

7. The system LSI according to claim 6, wherein said option instructions include a dividing option instruction and a maximum/minimum value option instruction.

8. The system LSI according to claim 6, wherein said processor is provided with an instruction cache and a data cache.

9. The system LSI according to claim 6, wherein said cache size, said instruction memory size, said data memory size, and said option instructions are provided in RTL templates accessible by the processor core.

10. A method for designing a processor core used in a processor with a memory operatively coupled to the processor core, the method comprising:
   selecting a cache size from given candidates;
   selecting an instruction memory size from given candidates;
   selecting a data memory size from given candidates;
   selecting of a plurality of option instructions that are provided respectively in correspondence with machine instructions to be implemented within said processor core and provided in general-purpose language and described in both RTL description and in one of behavior level description or C/C++ model description.

11. The method according to claim 10, wherein said option instructions include a dividing option instruction (DIV) and a maximum/minimum value option instruction (MINMAX).

12. The method according to claim 10, wherein said cache size, said instruction memory size, said data memory size, and said option instructions are provided in RTL templates accessible by the processor core.

13. The method according to claim 10, further comprising selecting optional hardware associated with said processor core.

* * * * *